United States Patent
Fujita

(10) Patent No.: US 6,418,073 B1
(45) Date of Patent: Jul. 9, 2002

(54) SEMICONDUCTOR MEMORY DEVICE

(75) Inventor: Mamoru Fujita, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/548,997

(22) Filed: Apr. 14, 2000

(30) Foreign Application Priority Data

May 14, 1999 (JP) ............................................ 11-134965

(51) Int. Cl.[7] .................................................. G11C 7/00
(52) U.S. Cl. ...................................... 365/203; 365/207
(58) Field of Search ................................. 365/203, 207, 365/205, 208

(56) References Cited

U.S. PATENT DOCUMENTS

| | | | | |
|---|---|---|---|---|
| 5,848,015 A | * | 12/1998 | Seno | 365/203 |
| 6,072,738 A | * | 6/2000 | Brown | 365/203 |
| 6,094,392 A | * | 7/2000 | Utsugi et al. | 365/203 |
| 6,144,601 A | * | 11/2000 | Takeda | 365/203 |

FOREIGN PATENT DOCUMENTS

| | | |
|---|---|---|
| JP | 62-197990 | 9/1987 |
| JP | 6-150656 | 5/1994 |
| JP | 11-86554 | 3/1999 |

* cited by examiner

*Primary Examiner*—Vu A. Le
*Assistant Examiner*—Anh Phung
(74) *Attorney, Agent, or Firm*—Scully, Scott, Murphy & Presser

(57) ABSTRACT

A semiconductor memory device is provided that can shorten the precharge time and accelerate the access time of the memory without increasing the chip size. The sense amplifier selection circuit 1 outputs a precharge control signal PDLD that carries out a specified precharge of bit lines BLT1 to BLTN and bit lines BLN1 to BLNn connected to sense amplifiers SA1 to SAn. A voltage transformer circuit 3 transforms the voltage value at H level of the input precharge control signal PDLB to a voltage VDV having a value higher than the value "Vcc+Ct1", which is the voltage power source Vcc added to the threshold value voltage Vt1 of the MOS transistors NM1 of the precharge drive circuits 51 to 5q, and outputting the result as the precharge drive voltage PDLD. The precharge drive circuits 51 to 5q are formed in the cross region, and formed by n-channel type MOS transistor NM1 and n-channel type MOS transistor NM2.

10 Claims, 13 Drawing Sheets

SEMICONDUCTOR MEMORY DEVICE

BACKGROUND OF THE INVENTION

1. Field of the Invention

The present invention relates to a semiconductor memory device for improving the precharge speed of a bit line in a precharge circuit in order to accelerate the reading and writing of data.

2. Description of the Related Art

In a semiconductor memory device such as a DRAM (dynamic random access memory), a precharge operation is carried out on the bit line pair connected to a sense amplifier at a timing cycle prior to the reading and writing of data. By accelerating the operation of this precharge, the read/write processing of data to the memory cell can be accelerated. FIG. 9 shows an example of the essential components of a circuit from the memory cell to the sense amplifier in a conventional DRAM.

In FIG. 9, the circuit that precharges each of the bit lines (BLT1–BLTn, BLN1–BLNn) of bit line pair BL1 to bit line pair BLn has the structure shown in FIG. 9, and specifically is structured by precharge drive circuit 1001 to precharge drive circuit 100q (q being a natural number), and precharge circuit SW1 to precharge circuit SWn. Respective memory cell MS1 to memory cell MSm (m being a natural number, and 2×n=m), for example, are connected to each of the bit lines (BLT1–BLTn, BLN1–BLNn) of bit line pair BL1 to bit line pair BLn.

When the data of memory cell MS1 is read, for example, the reading operation is carried according to the timing chart in FIG. 10. At this time, because the control signal PDLB1 is at L level, each of the bit lines of bit line pair BL1 to bit line pair BLn is precharged by precharge circuit SW1 to precharge circuit SWn.

First, at time t1, when a specified RAS address that indicates memory cell MS1 is input, the internal address signal output from the row address decoder circuit (not illustrated) is output, and the control signal RASB supplied externally inverts from H level to L level. Thereby, based on the input control signal RASB, at time t2 the sense amplifier selection circuit 1 outputs a control signal PDLB1 at H level to precharge drive circuit 1001 to precharge drive circuit 100q provided on the sense amplifier row associated with the specified address decoder.

In addition, at time 3, precharge drive circuit 1001 to precharge drive circuit 100q inverts each of the control signals PDL1 from H level to L level. Thereby, the charge operation of each of the bit lines of bit line pair BL1 to bit line pair BLn is completed. At this time, each of the bit lines of bit line pair BL1 to bit line pair BLn is charged, for example, to the value of Vcc/2 with respect to the power supply voltage Vcc of the memory.

Thereby, the MOS transistor that carries out the equalization of bit line pair BL1 to bit line pair BLn in precharge circuit SW1 to precharge circuit SWn is turned OFF, and the MOS transistor for the precharge power supply is turned OFF.

Additionally, at time t4, each of the bit lines of bit line pair BL1 to bit line air BLn becomes OPEN, and the inverts from L level to H level by the activation of the wordline SWL0.

As a result, when the data of H level is recorded in the memory cell MS1, the charge stored in the capacitor of the memory cell MS1 is supplied to the bit line BLT1, the voltage of bit line BLT1 rises above the precharge voltage "Vcc/2", and bit line BLN1 remains at precharge voltage "Vcc/2" to act as a dummy line.

Additionally, at time t5, an internal address signal is output from a column decoder (not illustrated) based on the column address supplied externally. Thereby, specified sense amplifier SA1, sense amplifier SA2, sense amplifier SAk (k being a natural number, and n>k) are activated. That is, bit line BLT1 and bit line BLN1 are connected to the sense line in the sense amplifier SA1, bit line BLT2 and bit line BLN2 are connected to the sense line in the sense amplifier SA2, . . . , and bit line BLTk and bit line BLNk are connected to the sense line in the sense amplifier SAk.

Thereby, the sense amplifier SA1 increases the voltage difference between bit line BLT1 and bit line BLN1, and H level data is output to the output drive via a column switch (not illustrated) and a data amplifier (not illustrated).

Additionally, at timing t6, the control signal RASB output from a row address decoder circuit (not illustrated) inverts from L level to H level. Thereby, at time t7, sense amplifier SA1, . . . , sense amplifier SAk are inactivated, wordline SWL10 is similarly deactivated, and H level inverts to L level. Thereby, each of the bit lines of bit line pair BL1 to bit line pair BLn becomes OPEN.

Additionally, at time t8, control signal RASB inverts to H level, and thereby the sense amplifier selection circuit 1 inverts the control signal PDLB1 from H level to L level.

As a result, at time t9, precharge drive circuit 1001 to precharge drive circuit 100q invert each control signal PDL1 from L level to H level. Thereby, the MOS transistors in precharge circuit SW1 to precharge circuit SWn are turned ON, and thus each of the bit lines of bit line pair BL1 to bit line pair BLn is precharged. In addition, at time t15, the voltages of each of the bit lines of bit line pair BL1 to bit line pair BLn become Vcc/2, and the precharge is completed.

By shortening the time of the charge from time t8 to time t15, the waiting time up to the reading of the data is shortened, and the read operation can be carried out rapidly. Reducing the time to turn ON the MOS transistors in precharge circuit SW1 to precharge circuit SWn and increasing the charge current of the MOS transistors in precharge circuit SWi to precharge circuit SWn are methods that can be considered for achieving this objective.

According to this method, the channel length of the MOS transistors in the precharge circuit SW1 to precharge circuit SWn is determined by such factors as voltage, and thus enlarging the transistor width of the MOS transistors in the precharge circuit SW1 to precharge circuit SWn or increasing the channel conductance (conductance) of these MOS transistors in the ON state can be considered.

However, because the channel width of the MOS transistors used would be enlarged, the surface area of the formation region of precharge circuit SW1 to precharge circuit SWn would increase. If this is done, since precharge circuit SW1 to precharge circuit SWn are formed in regions SA provided by the sense amplifier circuits, etc., shown in FIG. 11, the result is widening the boundary portion of the limited memory cell region MS, and thus the total chip area of the semiconductor memory device is increased. Here, FIG. 11 is a concept drawing showing the structure of a DRAM using a shared sense method.

Therefore, rather than enlarging the channel width of the MOS transistors that form precharge circuit SW1 to precharge circuit SWn, increasing the drive capability of the MOS transistors forming precharge circuit SW1 to precharge circuit SWn by decreasing the rise time of the electrical potential of the gates of these MOS transistors, that is, either by accelerating the timing of the precharge start by decreasing the turn-on time of these MOS transistors, or by increasing the channel conductance by increasing the gate voltage of these MOS transistors, can be considered.

However, in the above-described semiconductor memory device, the MOS transistors of precharge drive circuit 100₁ to precharge drive circuit 100q that conduct the charge current for driving the MOS transistors forming precharge circuit SW1 to precharge circuit SWn, which is to say, apply the charge to the gates of these MOS transistors, are formed by p-channel type MOS transistors PM.

In addition, precharge drive circuit 100₁ to precharge drive circuit 100q are each formed on the associated cross areas CR (refer to FIG. 11). Thus, when increasing the channel width of the MOS transistor PS in attempting to reduce the turn-on time of the MOS transistors that form precharge circuit SW1 to precharge circuit SWn, increasing the surface area of the cross area CR becomes necessary.

The vicinity of the cross area CR has the structure shown in FIG. 12, which is an enlargement of the region T in FIG. 11. Specifically, the region in which the MOS transistor PM can be formed is only the n-WELL region NW of in the cross region CR. In this figure, the region PA denotes the region (a p-substrate or a p-WELL region) forming the n-channel MOS transistors. SP is the separation region that separates the n-WELL region NW and the region forming the n-channel type MOS transistors. Because of this, there is the problem that to the extent the turn-on time of the MOS transistors forming precharge circuit SW1 to precharge circuit SWn is greatly reduced, the channel width of the MOS transistors PM will increase.

In addition, when the conductance of these MOS transistor channels is increased by rising the gate voltage of the MOS transistors forming precharge circuit SW1 to precharge circuit SWn, that is, by increasing the voltage level of the control signal PDL1, the voltage of the power source connected to the sources of the MOS transistors PM in precharge drive circuit 100₁ to precharge drive circuit 100q must be increased.

However, in the case that the voltage of the power source connecting the source is simply increased, the electric potential of the sources of the MOS transistors PM of the p-type dispersion layer and the n-type dispersion layer of the separation area SP that provides the specified well voltage to the n-WELL region acquires a forward bias (refer to FIG. 13), and unnecessary current flows to the p-type dispersion layer of the separation area SP via the n-WELL region NW from the source of the MOS transistor PM.

Because of this, while the voltage of the n-WELL areas NW can be made the same as that of the sources of the MOS transistors PM, sense amplifier SA1 to sense amplifier SAn are also formed in the n-WELL regions NW. Thus, when the voltage of the n-WELL region NW is raised, it becomes higher than the power source potential of the sense amplifiers, and when the capacity of the sense amplifiers is lowered, the access time of the semiconductor memory device slows.

Thus, one conception is that the n-WELL regions formed by the p-channel type MOS transistors of sense amplifier SA1 to sense amplifier SAn and the n-WELL regions formed by the MOS transistors PM in precharge drive circuit 100₁ to precharge drive circuit 100q would be separately formed, and thereby the voltage of the power source connected to the n-WELL region formed by the MOS transistor PM and the source of the MOS transistor PM could be raised.

However, as described above, when the n-WELL regions of different potentials are separately formed, a separate region SP that stabilizes each potential becomes necessary, and the area of the n-WELL in the cross area CR becomes very small. This means that, as shown in FIG. 3, respective specified values that are determined by the design rules of the layout are necessary for: the distance d1 between the diffusion layer of the MOS transistor PM and the n-type diffusion layer of the separation region SP; the width d2 of the n-type diffusion layer of the separation region SP; the distance d3 between the n-type diffusion layer of the separation region SP and the edge of the n-WELL; the distance d4 between the edge of the n-WELL and the p-type diffusion layer of the separation region SP; the width d5 of the p-type diffusion layer of the separation region SP; and the distance d6 between the p-type diffusion layer of the separation region SP and the diffusion layer of the n-channel type MOS transistor NM.

As a result, a sufficient channel width of the MOS transistor PM cannot be made established, and in this MOS transistor PM, the turn-on time of the MOS transistors forming precharge circuit SW1 to precharge circuit SWn becomes slow, and the effect of raising the voltage level of the control signal PDL1 is lost.

In addition, if the area of the separated n-WELL regions is increased in order to establish a sufficient channel width for the MOS transistor PM, the cross region CR substantially widens, and the chip size of the semiconductor storage circuit increases.

In consideration of the above problems, it is an object of the present invention to provide a semiconductor memory device that does not increase the chip size, reduces the precharge time, and accelerates the cycle time for accessing the memory.

SUMMARY OF THE INVENTION

In the semiconductor memory device according to a first aspect of the present invention, a memory cell region formed from a plurality of memory cells, a plurality of word lines that select the memory cells, a word line drive circuit that, based on an externally supplied address signal, activates the word line connected to the memory designated by that address, a bit line that is connected to this memory cell and reads information stored in the memory cell selected by the activated word line as the voltage change from the specified precharge voltage, a sense amplifier that amplifies the potential difference between the bit line pairs, which are two adjacent bit lines combined together, and detects the data stored in this memory cell, a precharge circuit that precharges the potential of the two bit lines of this bit line pair connected to this sense amplifier before the word line selects the memory cell, and a precharge drive circuit that supplies a control signal of a specified H level voltage from a second n-channel type MOS transistor to a gate of an n-channel type first MOS transistor that forms this precharge circuit and supplies the precharge current to the bit line are provided, wherein the voltage of the ON signal turns ON the second MOS transistor and is input into the gate of this second MOS transistor is equal to or greater then the voltage value equal to the sum of the voltage of this control signal and the threshold value voltage of the second MOS transistor.

In a second aspect of the semiconductor memory device according to the first aspect of the present invention, a voltage transformer circuit that outputs from the internal logic circuit an H level voltage of the charge signal that turns ON the second MOS transistor is provided, and this output voltage, serving as this ON signal, is equal to or greater than the voltage value that equals the sum of the voltage of the control signal and the threshold value voltage of this second MOS transistor.

In a third aspect of the semiconductor memory device according to the first and second aspect of the present invention, the voltage of the control signal is set to a higher value that the power source voltage that is used by the internal logic circuit.

In a fourth aspect of the semiconductor memory device according to any of the first through third aspects of the present invention, before a timing cycle in which the precharge circuit carries out the precharge for the bit line pairs, the voltage transformation circuit supplies the voltage-transformed voltage to the drive circuit.

In a fifth aspect of the semiconductor memory device according to any of the first through fourth aspects of the present invention, an n-channel type third MOS transistor is provided in which a source is grounded, a drain is connected to the gate of the first MOS transistor, and the precharge stop signal having a logic reverse that of the charge signal from the prior stage of the voltage transformation circuit is input into a gate In a sixth aspect of the semiconductor memory device according to any of the first through fifth aspects of the present invention, this precharge drive circuit is formed by the second MOS transistor and the third MOS transistor.

In a seventh aspect of the semiconductor memory device according to any of the first through sixth aspects of the present invention, at the part where the sense amplifier and the word line drive circuit intersect, there is a cross region wherein said sense amplifier, said word line drive circuit, or said memory cell are not formed, and the second MOS transistor and the third MOS transistor are formed in this cross region.

In a eighth aspect of the semiconductor memory device according to any of the first through seventh aspects of the present invention, at the part where the sense amplifier and the word line drive circuit intersect, there is a cross region wherein said sense amplifier, said word line drive circuit, or said memory cell are not formed, and the second MOS transistor is formed in one cross region, and the third MOS transistor is formed in the other cross area.

In a ninth aspect of the semiconductor memory device according to any of the first through eighth aspects of the present invention, a delay circuit is provided between the gate of the third MOS transistor and the stage before the voltage transformation circuit, wherein the propagation to the gate of the third MOS transistor of the precharge stop signal is delayed by a specified interval, that interval being only the time of the rise of the precharge stop signal.

In a tenth aspect of the semiconductor memory device according to any of the first through ninth aspects of the present invention, the channel width of the third MOS transistor is formed so as to be larger than the second channel width.

DETAILED DESCRIPTION OF THE INVENTION

Figure 1:
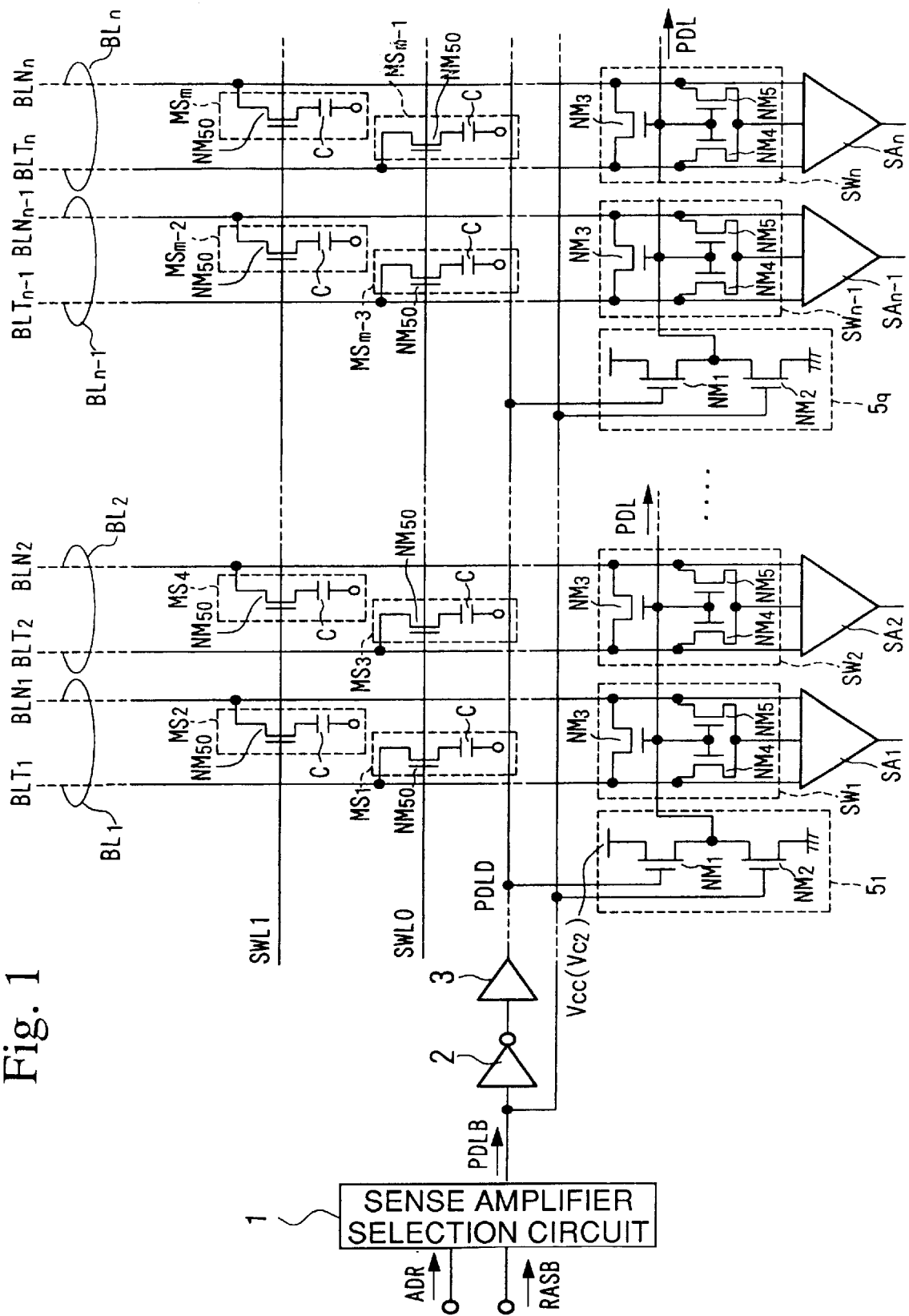
FIG. 1 is a block diagram showing the structure of a semiconductor memory device according to a first embodiment of the present invention.

Hereinafter, preferred embodiments of the present invention will be explained referring to the figures. FIG. 1 is a block diagram showing the structure of a semiconductor memory device according to a first embodiment of the present invention. In this figure, reference numeral 1 is a sense amplifier selection circuit that selects a sense amplifier row, for example, sense amplifier SA1 to sense amplifier SAn, associated with the internal address signal ADR based on this internal address signal ADR input from the row decoder (XDEC; refer to FIG. 11) at a timing cycle of the control signal RASB supplied externally.

In addition, the sense amplifier selection circuit 1 outputs a precharge control signal PDLB that precharges to a specified precharge voltage bit line BLT1 to bit line BLTn and bit line BLN1 to bit line BLNn, which are respectively connected to sense amplifier SA1 to sense amplifier SAn.

Figure 11:
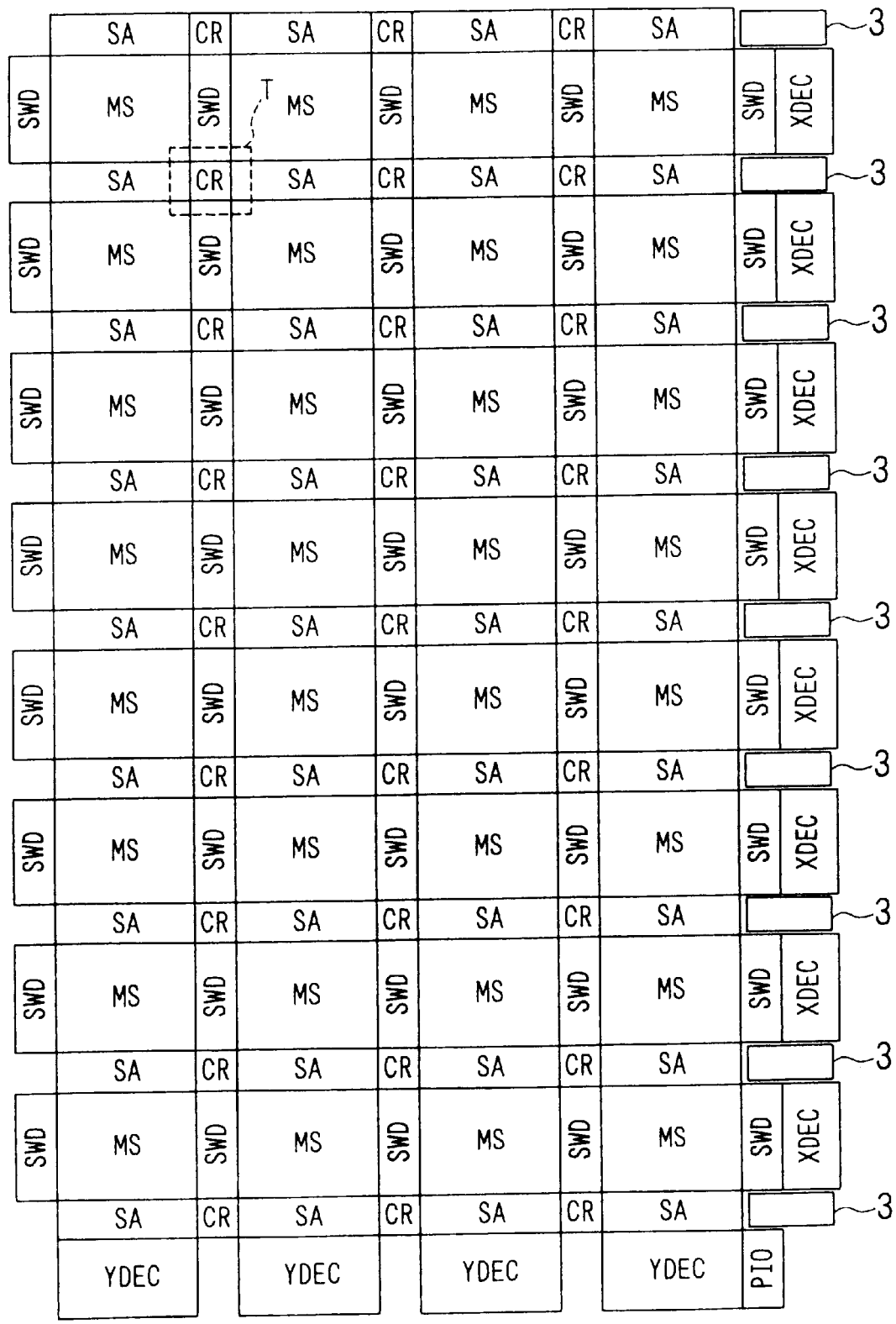
FIG. 11 is a concept diagram showing the structure of a DRAM using a shared sense design.
Figure 12:
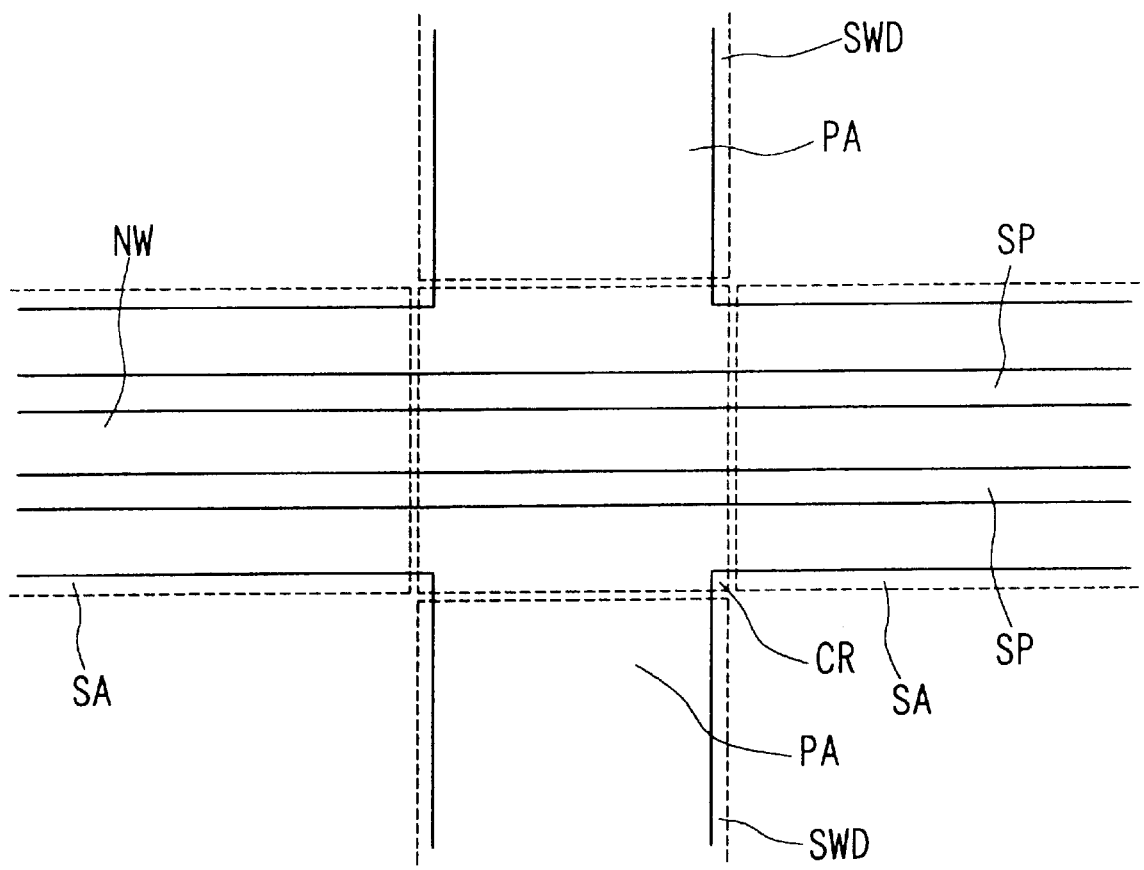
FIG. 12 is an enlarged diagram showing the cross region CR vicinity in FIG. 11 of a conventional example of a semiconductor memory device.
Figure 13:
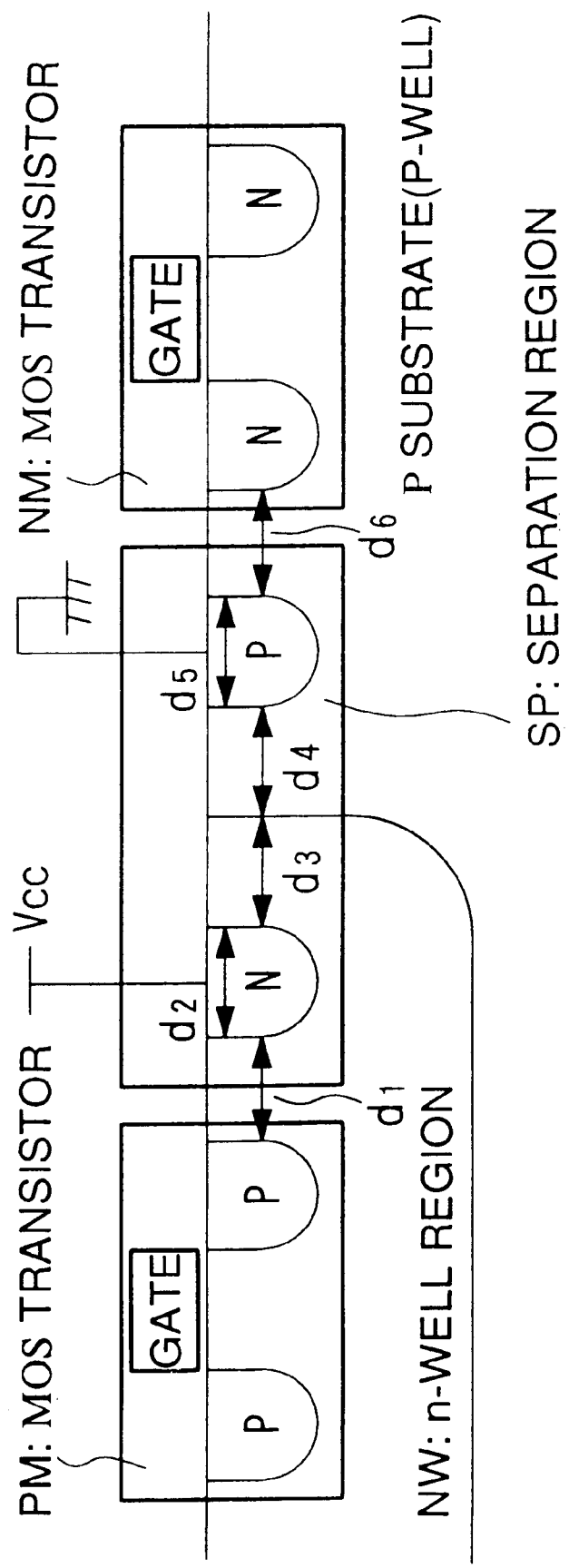
FIG. 13 is a cross-section on the vicinity of the n-WELL of the semiconductor memory device.

Reference numeral 2 is an inverter that inverts the signal polarity of the precharge control signal PDLB input from the sense amplifier selection circuit 1, and outputs the result to the voltage transformation circuit 3 (refer to FIG. 11).

The voltage transformation circuit 3 transforms the H level voltage value of the inverted input precharge control signal PDLB to a voltage VDV equal to or greater than the value "Vcc+Vt1", which is the power source voltage Vcc used by the logic circuit of the semiconductor memory device (not illustrated) added to the threshold value voltage Vt of the MOS transistor NM1 of the precharge drive circuit 51 (precharge drive circuit 52 to precharge drive circuit 5q), and outputs the result as a precharge drive signal PDLD. This voltage VDV is supplied before the timing cycle in which the precharge starts as a booster voltage VBOOT from a booster circuit (not illustrated). This means that at the point in time that the external control signal RASB is input at L level, the booster circuit supplies the booster voltage VBOOT to the voltage transformation circuit 3.

A precharge drive circuit 51 (precharge drive circuit 52 to precharge drive circuit 5q) is formed in the cross region CR (refer to FIG. 11), and is formed by the n-channel type MOS transistor NM1 and the n-channel type MOS transistor NM2. In addition, the precharge drive circuit 51 (precharge drive circuit 52 to precharge drive circuit 5q) outputs the precharge signal PDL at the H level when the precharge drive signal PDLD is input at H level.

This means that the MOS transistor NM1 of the precharge drive circuit 51 is turned ON when an H level precharge drive signal PDLD is input at the gate, and outputs the precharge signal PDL, for which the H level value is the voltage value of the power source voltage "Vcc", because the voltage of this precharge drive signal PDLD is equal to or greater than "Vcc+Vt1".

At this time, since the precharge control signal PDLB has a polarity opposite that of the precharge control signal PDLD, it is inverted to the L level. Thereby, the MOS transistor NM2 is turned OFF. In contrast, the precharge drive circuit 51 (precharge drive circuit 52 to precharge drive circuit 5q) outputs a precharge signal PDL at L level when the precharge drive signal PDLD is input at the L level.

This means that the precharge control signal PDLB inverts to the H level, since it has a polarity opposite to that of the precharge control signal PDLD. Thereby, the MOS transistor NM2 is turned ON, and the precharge control signal inverts from H level to L level. In addition, because the precharge control signal PDLB is input directly from the sense amplifier selection circuit 1 to the precharge drive circuit 51 (precharge drive circuit 52 to precharge drive circuit n), when it inverts from L level to H level, the precharge signal PDL can be rapidly inverted from H level to L level. At this time, the precharge control signal PDLD is turned OFF because the precharge drive signal PDLD in input at L level.

The precharge circuit SW1 (precharge circuit SW2 to precharge circuit SWn) is provided at region SA in FIG. 11, and is formed by the n-channel type MOS transistor NM3, the MOS transistor NM4, and MOS transistor NM5. In addition, the precharge circuit SW1 (precharge circuit SW2 to precharge circuit SWn) charges a bit line pair BL1 (bit line pair BL2 to bit line pair BLn) to a specified precharge voltage, for example, precharge voltage "Vcc/2", before the sense amplifier SA1 (sense amplifier SA2 to sense amplifier SAn) is activated.

Here, the MOS transistor NM3 is turned ON in the case that the input precharge signal is H level, and the voltage of the bit lines BLT1 and bit line BLTN1 that form the bit line pair BL1 are equalized to identical values.

The MOS transistor NM4 charges the bit line BLT1 to the voltage value "Vcc/2" when the drain is connected to the power source that supplies the precharge voltage, the source is connected to the bit line BLT1, and the precharge signal is input at the gate at H level. Similarly, the MOS transistor NM5 precharges the bit line BLN1 to the voltage value "Vcc/2" when the drain is connected to the power source that supplied the precharge voltage, the source is connected to the bit line BLN1, and the precharge signal is input at the gate at H level.

Memory cell MS1 and a plurality of memory cells (not illustrated) are connected to the bit line BLT1. Similarly, memory cell MS2 and a plurality of memory cells (not illustrated) are connected to bit line BLN1. In addition, a plurality of memory cells are also connected to the bit lines that form bit line pair BL2 to bit line pair BLn. Word line (sub-word line) SWL0 is connected to memory cell MS1, memory cell MS3, . . . , memory cell MS (m−3), and memory cell MS (m−1), and word line (sub-word line) SWL1 is connected to memory cell MS2, memory cell MS4, . . . , memory cell MS (m−2), and memory cell MSn.

Here, in the semiconductor memory device of this first embodiment, the structure of a partitioned word line design is used as an example, and the main word line (the output of the row decoder XDE in FIG. 11) is partitioned into a plurality of sub-word lines (the output of the sub-row decoder SWD in FIG. 11), and the selection of each memory cell is carried out.

Memory cell MS1 to memory cell MSm is formed in the memory cell region MS in FIG. 11, and comprises each of the n-channel type MOS transistors NM50 and capacitors C. For example, focusing on memory cell MS1, in the MOS transistor NM 50, the gate is connected to word line SWL0, the drain is connected to the bit line BLT1, and the source is connected to one end of the capacitor C. The other end of the capacitor C is connected to the power source at a specified voltage, for example, the voltage "Vcc/2". The structure of the other memory cells is identical.

In addition, in the capacitor C carries out the storage of data by the accumulation of charges depending on the voltage levels; that is, it carries out storage (memory) of data by storing charges depending on the state of the various data to be stored, so as to become a voltage higher that the voltage "Vcc/2", which serves as the H level data or becoming a voltage that is lower than "Vcc/2", which serves as the L level data.

For example, the row decoder XDEX and the sub-row decoder SWD (refer to FIG. 11) select the word line SWL0 based on the row address ADR, and the sub-row decoder SWD (refer to FIG. 11) activates this selected word line SWL0; that is, the word line SWL0 inverts to H level. Thereby, when the MOS transistor NM50 in the memory cell MS1 is turned ON and the H level data is stored in the capacitor C, the charge accumulated in the capacitor C transfers to the bit line BLT1, and the voltage of the bit line BLT1 rises only by the value corresponding to the capacity ratio of the bit line BLT1 and the capacitor C.

In contrast, if the L level data is stored in the capacitor C, when the word line SWL0 is activated, the charge of the bit line BLT1 transfers to the capacitor C, and the voltage of the bit line BLT1 is lowered only by the value corresponding to the capacity ratio of the bit line BLT1 and the capacitor C. When other memory cells MS2 to memory cell MSm and memory cells (not illustrated) have stored data in the same manner as the above-described memory cell MS1, and word line SWL0, word line SWL1, . . . , connected to each of them are activated, each of the stored data bits is output as a change in the voltage value of bit line BLT2 to bit line BLTn and bit line BLN2 to bit line BLNn, to the respectively associated bit line BLT2 to bit line BLTn and bit line BLN2 to bit line BLNn.

Bit line MLT1 to bit line BLTn and bit line BLN1 to bit line BLNn are respectively connected to sense amplifier SW1 to sense amplifier SAn at each bit line pair BL1 to bit line pair BLn that these bit lines form. Sense amplifier SA1 to sense amplifier SAn are provided in region SA in FIG. 11, and carry out detection of data stored in the capacitor C by amplifying the differences in each of the input voltages of the bit lines of the bit line pairs.

The Y switch provided at the region YDEC in FIG. 11 selects the data detected in sense amplifier SA1 to sense amplifier SAn based on the column address. Here, the selected data is output to a data amplifier (not illustrated), sent to the output buffer after amplification to the amplitudes of the contact voltage and the power source voltage Vcc by this data amplifier, and finally output to an external circuit via the input/output circuit PIO (refer to FIG. 11).

Figure 2:
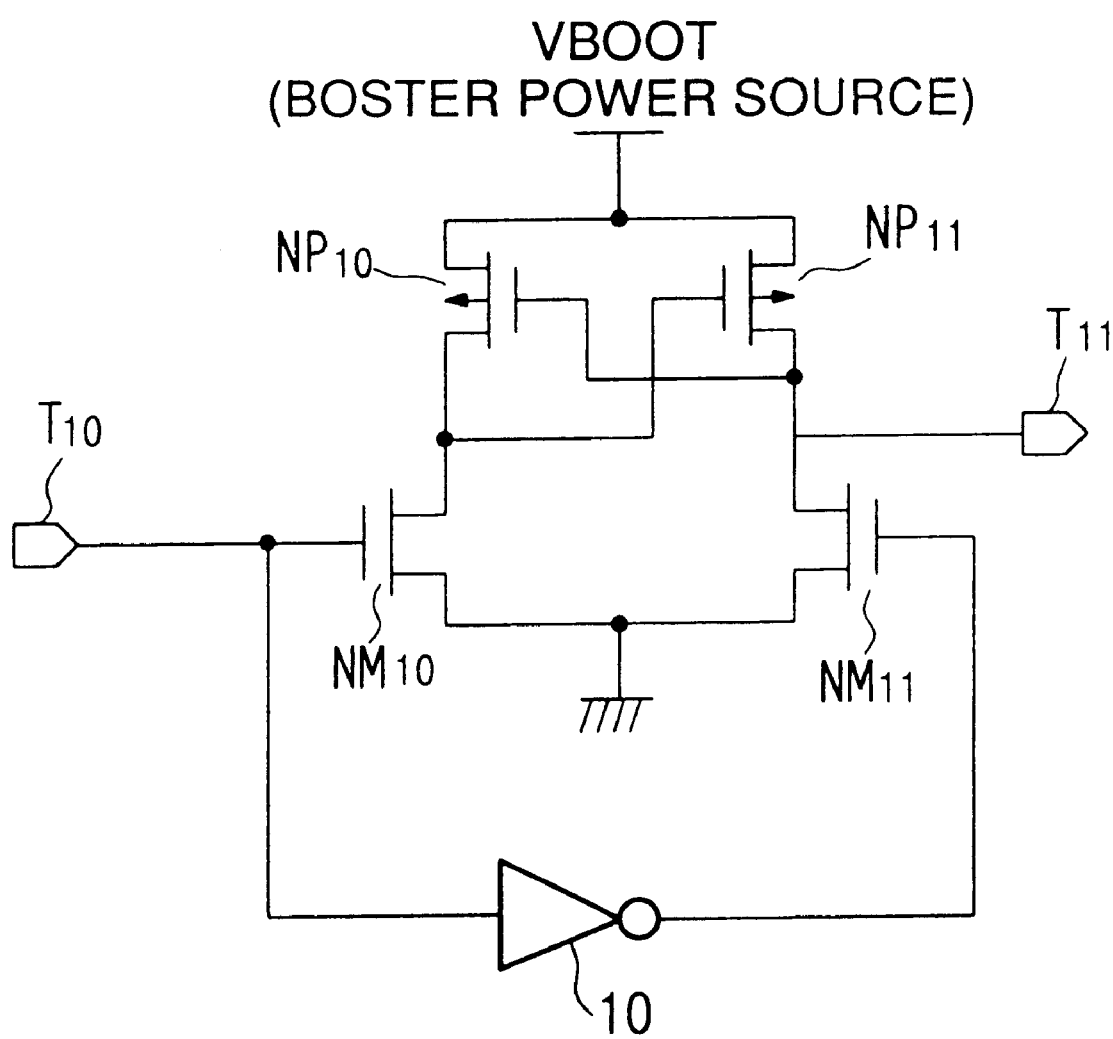
FIG. 2 is a concept diagram showing the structure of the voltage transformation circuit 3 shown in FIG. 1.

Next, the voltage transformer circuit 3 in FIG. 1 will be explained in detail referring to FIG. 2. FIG. 2 is a concept diagram showing the structure of a voltage transformer circuit 3. In this figure, NP10 is a p-channel type MOS transistor whose source is connected to the booster power source VBOOT, gate is connected to the terminal T11, and drain is connected to the drain of the MOS transistor 10. Here, the booster power source VBOOT is a voltage supplied from the booster circuit (not illustrated) to the voltage transformer circuit 3 before the timing cycle in which the precharge starts. In addition, the booster power source VBOOT applies a voltage higher than the value of the "Vcc+Vt1" used for the H level of the precharge drive signal PDLD.

This booster voltage VBOOT is supplied to the source of the MOS transistor NP10 and the source of the MOS transistor NP11 from the booster circuit (not illustrated) before the timing cycle in which the precharge operation is carried out. This means that the voltage transformer circuit 3 can supply the booster voltage VBOOT to precharge drive circuit 51 to precharge circuit 5q before the timing cycle in which the precharge operation is carried out.

The NP11 is a p-channel type MOS transistor whose source is connected to the booster power source VBOOT, gate is connected to the drain of the MOS transistor 10, and drain in connected to the terminal T11. The MOS transistor NM10 is an n-channel type MOS transistor with a grounded source, and whose drain is connected to the MOS transistor NP10 and gate is connected to terminal T10.

NM11 is an n-channel type MOS transistor with a grounded source, and whose drain is connected to the drain of the MOS transistor NP11 and gate is connected to the output terminal of the inverter 10. The inverter 10 inverts the signal from the inverter 2 that is input to the input terminal from the terminal 10, and outputs the result from the output terminal to the gate of the MOS transistor NM11.

The reason that the gate of the MOS transistor NP10 and the gate of the MOS transistor NP11 are connected to the respectively opposite drains of the MOS transistor is that the gate of the MOS transistor NP10 and the gate of the MOS transistor NP11 are set to the H level of the power source VBOOT, and turned completely OFF.

For example, when the sense amplifier selector circuit 1 outputs the precharge control signal PDLB at L level, the inverter 2 inverts the input precharge control signal PDLB, and outputs the result as an inverted H level signal. Thereby, at the terminal T10 the inverted precharge control signal PDLB is output at H level. In addition, in the NMOS transistor NM10, the inverted H level signal is input into the gate, and the drain is inverted to L level.

At the same time, at the input terminal of the inverter 10, the inverted H level signal is input, the inverter 10 inverts this inverted signal, and outputs the result to the gate of the MOS transistor NM11 as an L level signal. Thereby, the MOS transistor NM11 is turned OFF.

As a result, because the gate of the MOS transistor NP11 is set to L level, the MOS transistor NP11 is turned OFF, and the MOS transistor NM11 is turned OFF, the voltage level of the terminal T11 is raised to the H level. In addition, the gate of the MOS transistor NP10 is set to H level, and thus is turned OFF. At the same time, the voltage of the drain of the MOS transistor NM10 falls to an L level near the ground voltage.

Therefore, when the sense amplifier selection circuit 1 outputs the precharge control signal PDLB at L level, the voltage transformer circuit 3 outputs a precharge drive signal PDLD having the voltage level of the booster voltage VBBT (voltage VDV) having a value higher than "Vcc+ Vt1", which has the threshold value voltage Vt1 of the MOS transistor NM1 added.

In addition, contrariwise, when the sense amplifier selection circuit 1 outputs the precharge control signal PDLB at H level, the inverter 2 inverts the input precharge control signal PDLB, and outputs as a result the inverted L level signal. Thereby, at the terminal T10, the inverted signal of the precharge control signal PDLB is output at L level. In addition, at the NMOS transistor NM10, inputs to the gate the inverted signal at L level, and turns OFF.

At the same time, the inverted level L signal is input into the input terminal of the inverter 10, the inverter 10 inverts this inverted signal, and outputs the result to the gate of the MOS transistor NM11 as an H level signal. Thereby, the MOS transistor NM11 is turned OFF.

As a result, because the gate of the MOS transistor NP11 is set to the H level, the MOS transistor NP11 is turned OFF, and the MOS transistor NM11 is turned ON, the voltage level of the terminal T11 is lowered to L level. In addition, the MOS transistor NP10 is turned ON because the gate is set to L level. At the same time, the voltage of the drain of the MOS transistor NM10 rises to the H level voltage value of the booster voltage VBOOT.

Therefore, when the sense amplifier selection circuit 1 outputs the precharge control signal PDLB at L level, the voltage transformation circuit 3 outputs the precharge drive signal PDLD at the L level having the voltage value of the ground voltage.

Figure 3:
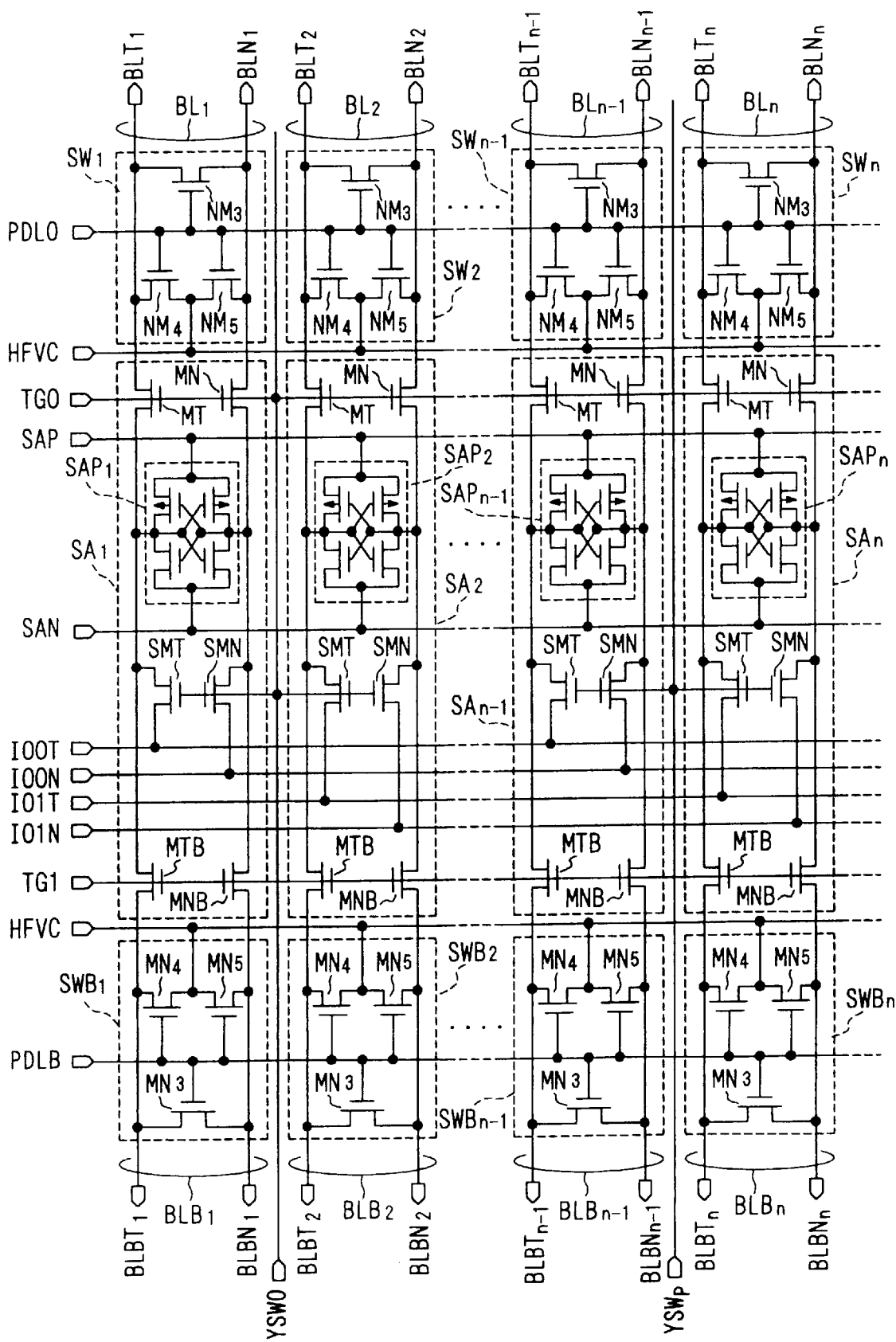
FIG. 3 is a concept diagram showing the structure of sense amplifier circuit SA1 to sense amplifier circuit SAn and the peripheral circuits shown in FIG. 1.

Next, sense amplifier SA1 to sense amplifier SAn in FIG. 1 will be explained in detail referring to FIG. 3. FIG. 3 is a concept drawing showing the structure of sense amplifier SA1 to sense amplifier SAn and the peripheral circuits. In this figure, parts identical to those in FIG. 1 have identical reference numerals, and their explanations are omitted. Moreover, the sense amplifier structure in this embodiment is a shared-type sense amplifier, which is formed such that two groups of bit line pairs share one sense amplifier (not illustrated in FIG. 1).

For example, in the sense amplifier SA1, as shown in FIG. 1, bit line pair BL1 formed by bit line BLT1 and bit line BLN1 is connected to bit line pair BLB1 formed by bit line BLBT1 and bit line BLBN1, and identification of the memory level of the memory cells provided on each is carried out selectively.

Similarly, in sense amplifier SA2 to sense amplifier SAn, bit line pair BL2, . . . , bit line pair BLn each formed by bit line BLT 2, . . . , bit line BLTn and bit line BLN2, . . . , bit line BLNn are connected to bit line pair BLB2, . . . , bit line pair BLBn formed by bit line BLBT2, . . . , bit line BLBTn and bit line BLBN2, . . . , bit line BLBNn, and identification of the memory level of the memory cells provided on each one is carried out selectively.

Sense amplifier circuit SA1 comprises sense amplifier SAP1 and n-channel type MOS transistor MT, n-channel type MOS transistor MN, n-channel type MOS transistor MTB, n-channel type MOS transistor MNB, n-channel MOS transistor SMT, and n-channel MOS transistor SMN.

Similarly, sense amplifier SA1 to sense amplifier SAn comprise each of sense amplifiers SAP2, . . . , sense amplifier SAPn, and n-channel type MOS transistor MT, n-channel type MOS transistor MN, n-channel type MOS transistor MTB, n-channel type MOS transistor MNB, n-channel MOS transistor SMT, and n-channel MOS transistor SMN.

In MOS transistor MT and MOS transistor MN in sense amplifier circuit SA1 to sense amplifier circuit SAn, when the selection signal G0 supplied from an internal circuit (not illustrated) is set at H level, in the shared-type sense amplifier, bit line pair BL1, ..., bit line pair BLn are selected, and connected to sense amplifier SAP1, ..., sense amplifier SAPn. At this time, the selection signal TG1 inverts to L level.

In contrast, in MOS transistor MTB and MOS transistor MNB in sense amplifier circuit SA1 to sense amplifier circuit SAn, when the selection signal G1 input from an internal circuit (not illustrated) is set at H level, in the shared-type sense amplifier construction, bit line pair BLB1, ..., bit line pair BLBn are selected and connected to sense amplifier SAP1, ..., sense amplifier SAPn. At this time, selection signal TG0 inverts to L level.

Sense amplifier SAP1 to sense amplifier SAPn are flip-flop type sense amplifiers formed by n-channel type MOS transistors and p-channel type MOS transistors (arrows attached), and carry out amplification of the voltage difference between the bit lines that form each of the connected bit line pairs BL1, ..., bit line pair BLn, or connected bit line pair BLB11, ..., bit line pair BLBn. In addition, before the timing cycle that carries out amplification processing, the power source signal SAP is set to H level and power is supplied, the power signal SAN is set to L level and grounded, and sense amplifier SAP1 to sense amplifier SAPn become activated. When the sense amplifier SAP1 to sense amplifier SAPn are not activated, the power source signal SAP and the power source signal SAN are both set to an H level or an L level state, or become a high impedance state.

For example, by selection signal TG0 being set at H level, the MOS transistor MT and the MOS transistor MN is turned ON, in which case the source and drain are conductive, and the bit line pair BL1 is connected to the sense amplifier SAP1. At this time, the word line SWL0 is activated.

As a result, the sense amplifier SAP1 amplifies the difference between the voltage of the bit line BLT1 that has been changed from the precharge voltage by the charge, which is the data stored in the capacitor C of the memory cell MS1 (refer to FIG. 1), and the voltage of bit line BLN1 remains at the precharge voltage.

The MOS transistor MTB and the MOS transistor MNB in the sense amplifier circuit SA1 to sense amplifier circuit SAn are an n-channel type, and output the bit line voltage amplified by the sense amplifier SAP1, ..., sense amplifier SAPn to the associated data line.

For example, when the selection signal TG0 is at H level, and the internal address signal YSW0 is at H level, the MOS transistor SMT and MOS transistor SMN of the sense amplifier circuit SA1 and the sense amplifier circuit SA2 are turned ON. Thereby, the voltage of the bit line BLT1 having the amplified voltage difference is output to the data line IO0T via the MOS transistor SMT, and the voltage of bit line BLN1 having the amplified voltage difference is output to data line IO0N via the MOS transistor SMN.

Similarly, the voltage of the bit line BLT2 having the amplified voltage difference is output to the data line IO1T via the MOS transistor SMT, and in addition, the voltage of the bit line BLN2 having the amplified voltage difference is output to the data line IO1N via the MOS transistor SMN. At this time, the inner address signal YSW2 to inner address signal YSWp (p being an integer) inverts to L level. Here, the inner address signal YSW0 to inner address signal YSWp are output from the column decoder (YDEC shown in FIG. 11) not illustrated based on the column address supplied from an external circuit of the semiconductor memory device.

In addition, when the selection signal TG0 is at H level and the internal address signal YSWm is at H level, sense amplifier circuit SA (n−1) to sense amplifier circuit SAn of the MOS transistor SMT and MOS transistor SMN are turned ON. Thereby, the voltage of the bit line BLT (n−1) having the amplified voltage difference is output to the data line IO1T via the MOS transistor SMT, and in addition, the voltage of the bit line BLN (n−1) having the amplified voltage difference is output to the data line IO0N via the MOS transistor SMN.

Similarly, the voltage of the bit line BLTn having the amplified voltage difference is output to the data line IO1T via the MOS transistor SMT, and in addition, the voltage of the bit line BLNn having the amplified voltage difference is output to the data line IO1N via the MOS transistor SMN. At this time, the inner address signal YSW0 inverts to L level.

Next, precharge circuit SW1 to precharge circuit SWn supply to each bit line pair BL1 to bit line pair BLn from the voltage source HFVC a precharge voltage (for example, Vcc/2) by the precharge signal PLD input from the voltage transformer circuit 3 shown in FIG. 1 being set to H level. Similarly, one shared precharge circuit SWB1 to precharge circuit SWBn supply to each of bit line pair BLB1 to bit line pair BLBn from power source HFVC a precharge voltage (for example, Vcc/2) by the precharge signal PLDB input from a voltage transformer circuit (not illustrated) being set at the H level.

Figure 4:
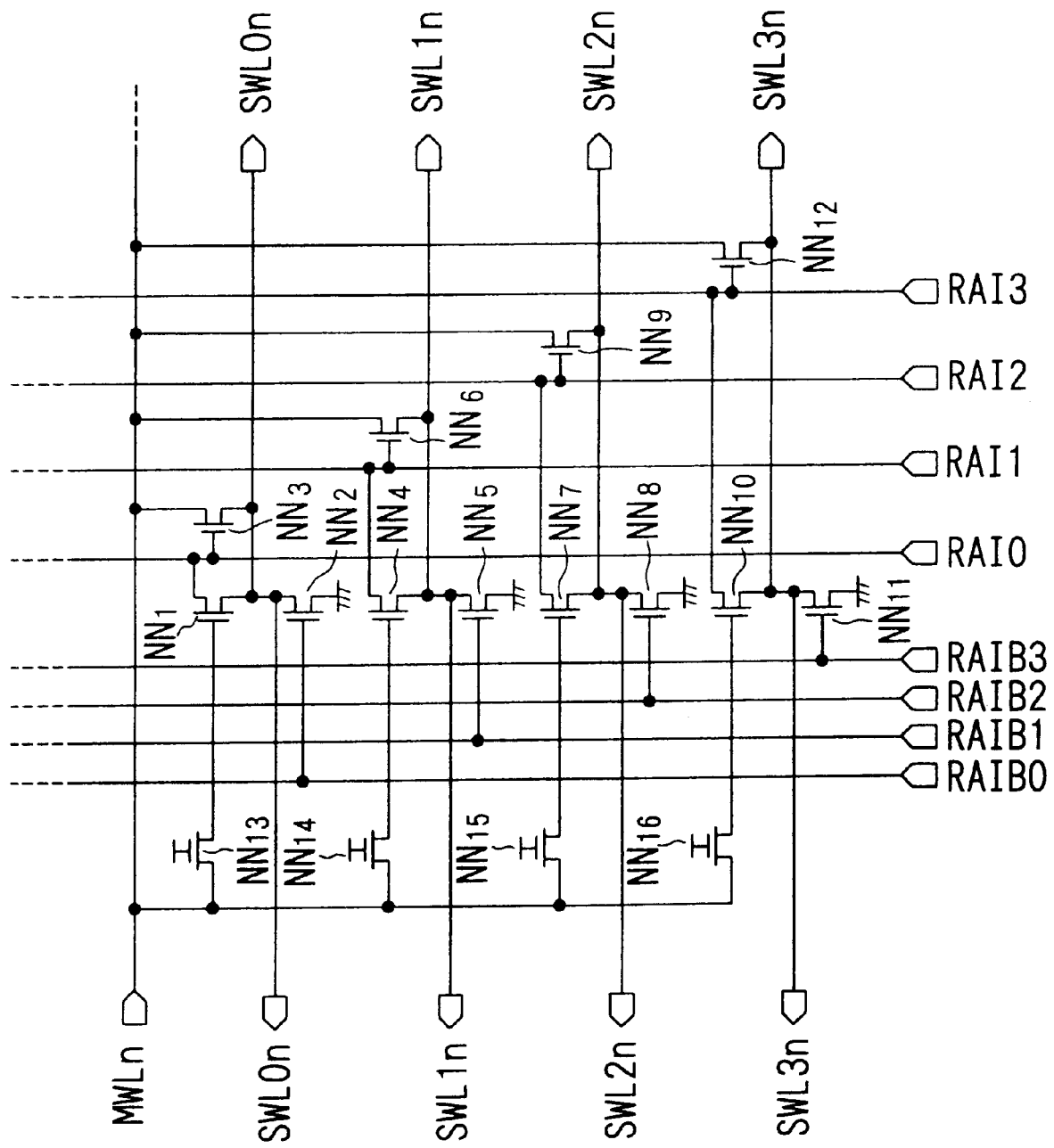
FIG. 4 is a block diagram showing the sub-row decoder SWD shown in FIG. 11.

Next, referring to FIG. 4, the sub-row decoder SWD, shown in FIG. 11, that activates the word line SWL0 and word line SWL1 in FIG. 1 will be explained. FIG. 4 is a block drawing shown in the structure of the sub-row decoder SWD shown in FIG. 11. In this figure, NN1 to NN16 are n-channel type MOS transistors. When the main word line MWL is activated, the main word line MWL is set at a specified voltage at H level, the gate of the MOS transistor NN1 is set to H level via the MOS transistor NN13, and the MOS transistor NN1 is turned ON.

Similarly, when the main word line MWL is activated, the main word line MWL is set to the specified voltage at H level, and the respective gates of MOS transistor NN4, MOS transistor NN7, and MOS transistor NN10 are set to H level via the MOS transistor NN14, the MOS transistor NN15, and MOS transistor NN16, and the respective MOS transistor NN4, MOS transistor NN7, and MOS transistor NN10 are turned ON.

Here, the gates of MOS transistor NN13 to MOS transistor NN16 are inverted to H level using a specified voltage. This means that the MOS transistor NN13 to MOS transistor NN16 form a low current circuit.

In addition, internal address RAI0 to internal address signal RAI3 and the internal address RAIB0 to internal address signal RAIB3 are output from the main word line decoder XDEC based on the row address supplied from an external circuit.

Internal address signal RAI0 and internal address signal RAIB0, internal address signal RAI1 and internal address signal RAIB1, internal address signal RAI2 and internal address signal RAIB2, and internal address signal RAI3 and internal address signal RAIB3 each has a relationship of being a signal that is complementary to the other. For example, when the internal address signal RAI0 is at H level, the internal address signal RAIB0 is at the L level, and when internal address signal RAI0 is at the L level, the internal address signal RAIB0 is at the H level. In addition, the relationships between the other internal address signal RAI1 to internal address signal RAI3 and address signal RAIB1 to internal address signal RAIB3 are also the same as the relationship between the above-described internal address signal RAI0 and internal address signal RAIB0.

Assuming, for example, that the MWLn is activated and is set to H level, the internal address signal RAI0 is output at H level, and the internal address signal RAI1 to internal address signal RAI3 are output at L level. At this time, the internal address signal RAIB0 is output at L level, and the internal address signal RAIB1 to internal address signal RAIB3 are output at H level.

Therefore, by the MOS transistor NN1 being turned ON and the MOS transistor NN2 being turned OFF, the specified voltage at H level of the internal address signal RAI0 sets the gate of the MOS transistor NN3 at H level, and the MOS transistor NN3 is turned ON. Thereby, the word line SWL0n (word line SWL0) is activated and set to H level.

In contrast, because the internal address signal RAI1 to internal address signal RAI3 are at L level, MOS transistor NN6, MOS transistor NN9, and MOS transistor NN12 are each turned OFF, and because internal address signal RAIB1 to internal address signal RAIB3 are at level H, MOS transistor NN5, MOS transistor NN8, and MOS transistor NN11 are each turned ON, and thus word line SWL1n (word line SWL1) to word line SWL3n are not activated, and remain at L level.

Figure 5:
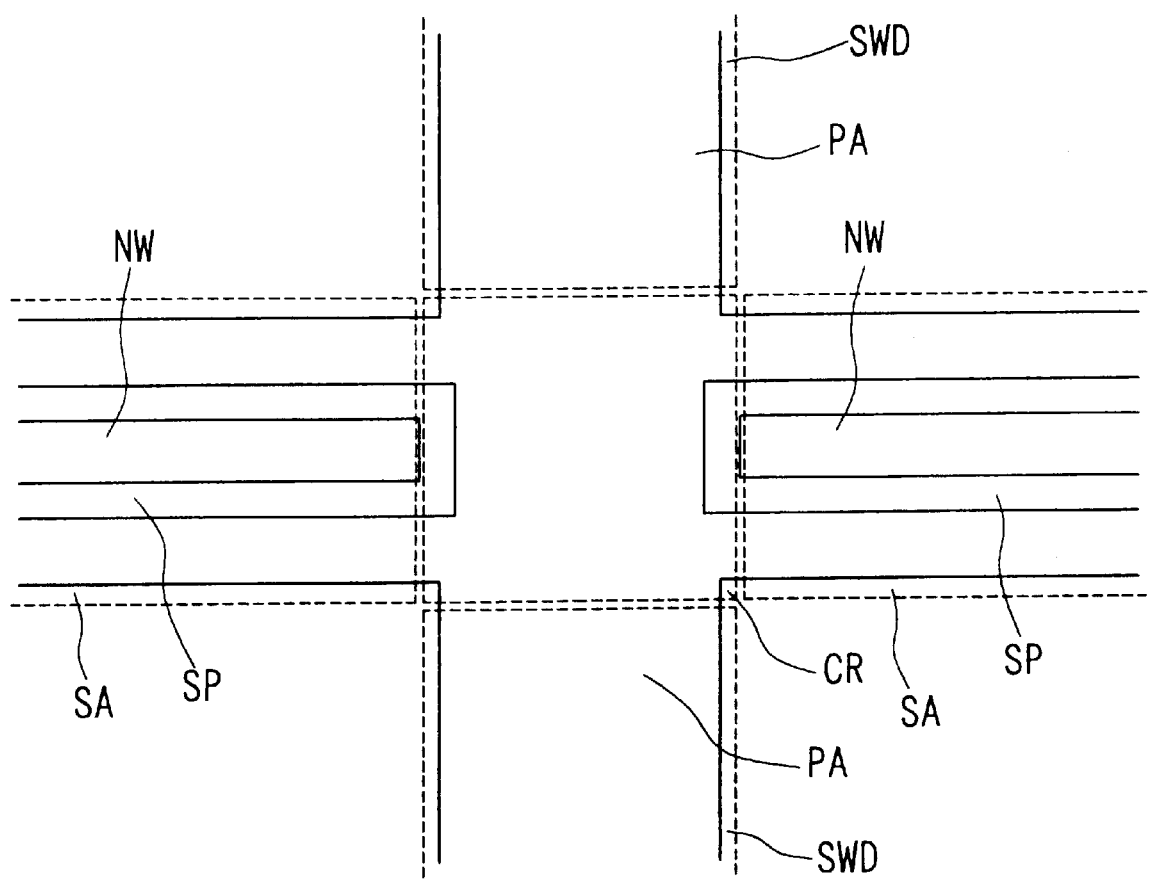
FIG. 5 is an enlarged diagram of the cross region CR vicinity of the concept diagram of the semiconductor memory device shown in FIG. 11 in the present invention.

As described above, in the semiconductor memory device according to the first embodiment of the present invention, precharge drive circuit 51 to precharge drive circuit 5q are formed by MOS transistor NM1 and MOS transistor NM2, which are all n-channel types. Thus, as shown in the figure of the vicinity of the cross region CR in FIG. 5, which enlarges the part of the region T in FIG. 11, in the semiconductor memory device according to the first embodiment of the present invention, forming the n-WELL region NW in the cross region CR becomes unnecessary, and the separation region SP for separating the n-WELL region NW and the p-WELL region becomes unnecessary within the cross region CR. Thus, in the cross region CR, MOS transistor NM1 and MOS transistor NM2 can be formed having a channel width that is large in comparison to the conventional technology without increasing the chip size. The cross region CR and the sub-row decoder SWD are a p-WELL (or a p-type substrate) formed by an n-channel type MOS transistor. PA is the formation region of the n-channel type MOS transistor.

In addition, in the semiconductor memory device according to the first embodiment of the present invention, the MOS transistor NM1 of the precharge drive circuit 51 to precharge drive circuit 5q is not a p-channel type MOS transistor formed within an n-WELL, and thus the mobility of the carrier is high in comparison to the p-channel type, and because a precharge drive signal PDLD having a voltage higher than the value of "Vcc (the potential of the n-WELL formed by sense amplifier SA1 to sense amplifier SAn)+ Vt1" is input at the gate to drive the semiconductor memory device, the conductance of the ON state is improved, and the precharge signal PDL can be inverted from L level to H level. As a result, in the semiconductor memory device according to a second embodiment of the present invention, the MOS transistor NM3 to MOS transistor NM5 forming the precharge circuit SW1 to precharge circuit SWn can be inverted to the ON state rapidly, and after the control signal RASB is input, the time taken to reach the precharge state is reduced compared to the conventional technology, and the acceleration of the access time becomes possible.

In the semiconductor memory device according to the first embodiment of the present invention, before the timing cycle in which the precharge operation is carried out, the booster voltage VBOOT, used by the precharge drive signal PDLD described above, is supplied to the source of the MOS transistor NP10 an the source of the MOS transistor NP11 from a booster circuit (not illustrated). Due to this, in the semiconductor memory device according to the first embodiment of the present invention, before the timing cycle in which the precharge operation is carried out, because the booster voltage VBOOT is supplied to precharge drive circuit 51 to precharge drive circuit 5q, at the same time the selection signal PDLB is output from the sense amplifier selection circuit 1, the voltage transformation circuit 3 can rapidly apply a booster voltage VBOOT to the precharge signal PDLD, and can rapidly invert the precharge signal PDL from the L level to the H level.

Figure 6:
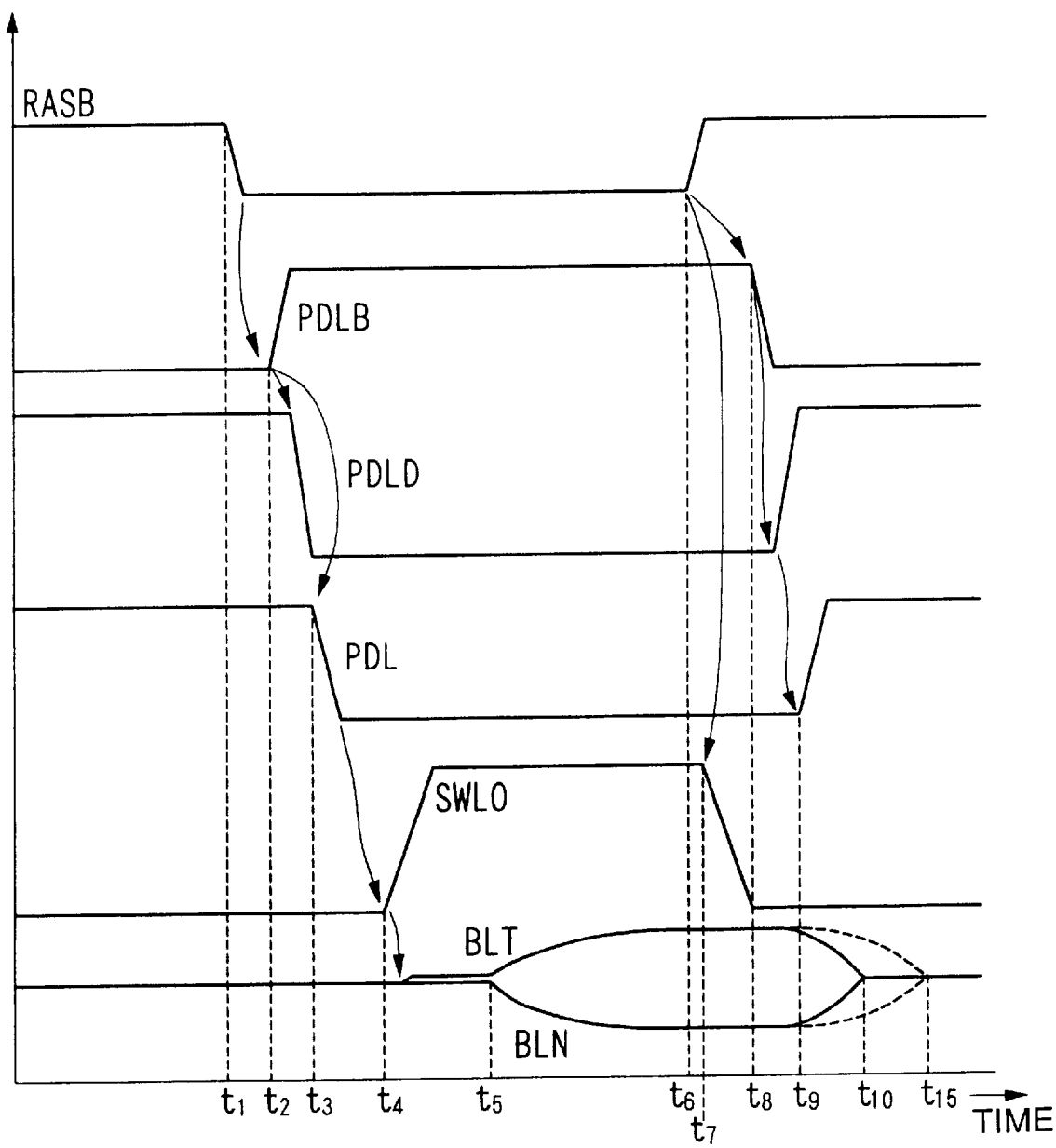
FIG. 6 is a timing chart showing an example of the operation of the semiconductor memory device according to a first embodiment of the present invention.

Next, referring to FIG. 1, FIG. 3, and FIG. 6, an example of the operation of the first embodiment will be explained. FIG. 6 is a timing chart showing an example of the operation of the semiconductor memory device shown in FIG. 1.

When the data of memory cell MS1 is read, for example, the read operation is carried out according to the timing chart in FIG. 6. At this time, because the control signal RASB is at H level, in each of the bit lines of bit line pair BL1 to bit line pair BLn, the control signal PDLB is at L level.

Thus, from the voltage transformer circuit 3, a precharge drive signal PDLD having a value higher than "Vcc+VT1" with respect to each precharge circuit SW1 to precharge circuit SWn is output. Thereby, each precharge circuit SW1 to precharge circuit SWn carries out precharge processing on each of the bit lines of the connected bit line pair BL1 to bit line pair BLn.

Next, at time t1, when a specified RAS address indicating memory cell MS1 is input, the internal address signal output from the row address decoder (not illustrated) is output, and the control signal RASB supplied externally inverts from H level to L level. Thereby, at time t2, the sense amplifier selection circuit 1 outputs a control signal PDLB at level H to precharge drive circuit 51 to precharge drive circuit 5q provided at sense amplifiers associated with a specified address decoder based on the input control signal RASB. At the same time, a booster circuit (not illustrated) stops the supply of the booster voltage VBOOT to the voltage transformer circuit 3.

In addition, at time t3, each precharge drive circuit 51 to precharge drive circuit 5q inverts the control signal PDL from H level to L level. Thereby, each of the charge operations on each of the bit lines of bit line pair BL1 to bit line pair BLn is completed. At this time, each of the bit lines of bit line pair BL1 to bit line pair BLn is charged to, for example, Vcc/2 with respect to the power source voltage Vcc of the memory.

Thereby, between complementary bit lines of bit line pair BL1 to bit line pair BLn in precharge circuit SW1 to precharge circuit SWn, for example, the bit line BLT1 that forms the bit line pair BL1 and the MOS transistor NM3 that carries out equalization of bit line BLN1, are turned OFF, and the MOS transistor NM4 and MOS transistor NM5 for precharge current supply are turned OFF. As a result, each of the bit lines in bit line pair BL1 to bit line pair BLn is OPENed, no matter where it is electrically connected.

In addition, at time t4, the sub-row decoder activates SWD by inverting the level of word line SWL0 from L level to H level.

As a result, assuming that the data H is recorded in memory cell MS1, the charge accumulated in the capacitor of the memory cell MS1 is supplied to the bit line BLT1, the voltage of bit line BLT1 rises above the precharge voltage "Vcc/2", and the bit line BLN1 remains at precharge voltage "Vcc/2" to act as a dummy line.

Additionally, at time t5, based on the column address supplied externally, the internal address signal is output from the column decoder (YDEC; refer to FIG. 11). Thereby, the sense amplifiers, including specified sense amplifier SA1, sense amplifier SA2, . . . , sense amplifier SAk (where k is a natural number, and n>k), are activated. This means that bit line BLT1 and bit line BLN1 are connected to the sense line in sense amplifier SA1, bit line BLT1 and bit line BLN2 are connected to the sense line in sense amplifier SA2, . . . , and bit line BLTk and bit line BLNk are connected to the sense line in sense amplifier SAk.

Thereby, sense amplifier SA1 amplifies the voltage difference between bit line BLT1 and bit line BLN1, and outputs the H level data to the output driver via a column switch (not illustrated) and a data amplifier (not illustrated).

Additionally, at time t6, the control signal RASB output from the row address decoder circuit (XDEC; refer to FIG. 11) is inverted form L level to H level. Thereby, at time t7, sense amplifier SA1, . . . , sense amplifier SAk are deactivated, the word line SWL0 is similarly deactivated, and H level is inverted to L level. Thereby, each of the bit lines from bit line pair BL1 to bit line BLn is OPENed.

Additionally, at time t8, because the control signal RASB is inverts to H level, the sense amplifier selection circuit 1 inverts the control signal PDLB from H level to L level. In addition, at the same time the control signal RASB is inverted to H level, the booster voltage VBOOT is supplied from a booster circuit (not illustrated) to the source of the MOS transistor NP10 and the source of the MOS transistor NP11 of the voltage transformer circuit 3.

As a result, at time t9, precharge drive circuit 51 to precharge drive circuit 5q invert each control signal PDL from L level to H level. Thereby, the MOS transistors in precharge circuit SW1 to precharge circuit SWn are turned ON, and each of the bit lines of bit line pair BL1 to bit line pair BLn are precharged. In addition, at time t10, the voltage of each of the bit lines of bit line pair BL1 to bit line pair BLn becomes "Vcc/2", and the precharge is completed. In the case of the precharge circuit of a conventional semiconductor memory device, the time required for the precharge takes up to time t15.

At this time, for the precharge time from time t8, because an n-channel type MOS transistor NM1 having a charge mobility higher than a p-channel type transistor is used, and in addition, the H level of the precharge drive signal PSLS becomes the serves as voltage VBOOT, which is higher than "Vcc+Vt1", the conductance of the ON state of the MOS transistor NM1 is improved, and because the channel width can be made larger than that of the p-channel type transistor, the rise from time t9 of the precharge signal PSL can be made more rapid, and the time the MOS transistor NM3 in precharge circuit SW1 to precharge circuit SWn needs to transit to the ON state can be reduced.

In addition, by making the channel width of the MOS transistor circuit NM2 wider than the MOS transistor of the precharge drive circuit, when the precharge operation to a bit line is stopped, even if a constant current flows between the MOS transistor NM1 and the MOS transistor circuit NM2, because the MOS transistor NM2 can cause the current of the MOS transistor NM1 to flow sufficiently to the ground point, the level of the precharge signal can be rapidly inverted from H level to L level.

Furthermore, because the conductance of the ON state of the MOS transistor NM3, the MOS transistor NM4, and the MOS transistor NM5 that form precharge circuit SW1 to precharge circuit SWn is improved, the voltage of H level of the precharge signal PDL can be made higher than the voltage Vcc used by the internal circuit.

At this time, a booster voltage Vc2 higher than the power source voltage Vcc (the potential of the N-WELL forming sense amplifier SA1 to sense amplifier SAn) is connected to the drain of the MOS transistor NM1 of precharge drive circuit 51 to precharge drive circuit 5q. In addition, assuming that the threshold value voltage of MOS transistor NM3, MOS transistor NM4, and MOS transistor NM5 is "Vt2", the voltage of the precharge drive signal PDLD is preferably a voltage higher than "Vc2+Vt1+Vt2".

Therefore, a booster circuit (not illustrated) supplies a booster voltage VBOOT, that is higher than "Vc2+Vt1+Vt2" to the voltage transformer circuit 3.

By implementing the above steps, the voltage Vc2 can be effectively applied to the gates of the MOS transistor NM3, the MOS transistor NM4, and the MOS transistor NM5.

As a result, the conductance of the ON state of the MOS transistor NM3, MOS transistor NM4, and MOS transistor NM5 that form precharge drive circuit SW1 to precharge drive circuit SWn can be improved, and the precharge time for each of the bit lines that forms bit line pair BL1 to bit line pair BLn can be shortened. At this time, because the MOS transistor NM1 is not a p-channel type MOS transistor, a voltage boosted higher than the power source voltage Vcc (that is, the potential of the N-WELL forming sense amplifier SA1 to sense amplifier SAn) can be applied to the drains.

Above, the first embodiment of the present invention has been described referring to the figures, but the concrete structure is not limited to this embodiment, and design changes, etc., that do not depart from the gist of the present invention are included in the present invention.

Figure 7:
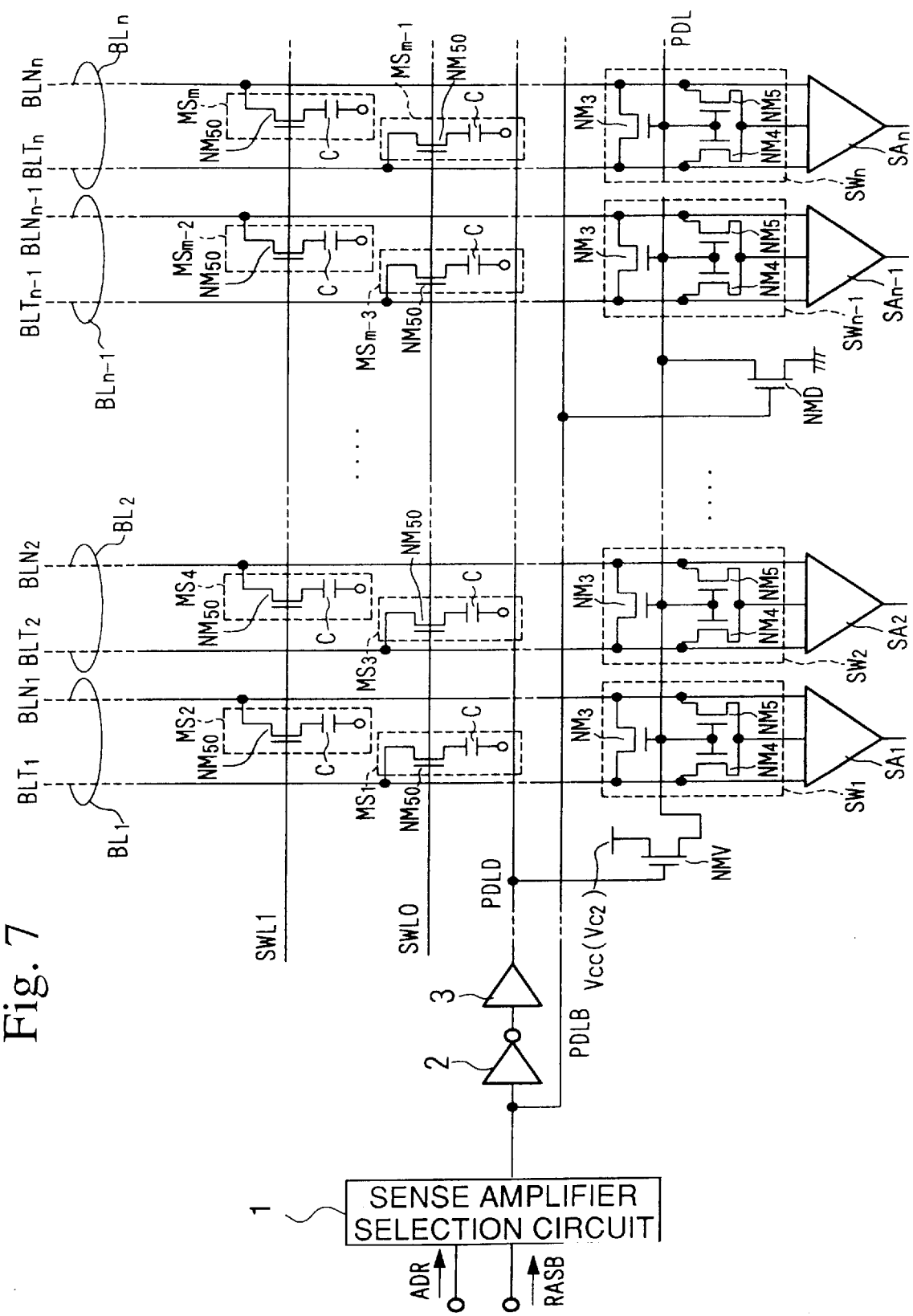
FIG. 7 is a block diagram showing the structure of a semiconductor memory device according to a second embodiment of the present invention.

For example, the structure of the semiconductor memory device shown in FIG. 7 is also possible. In the structure shown in FIG. 7, identical reference numerals denote identical parts in FIG. 1 (the above first embodiment), and their explanation is omitted.

Precharge drive circuit 51 to precharge drive circuit 5q in the first embodiment are formed for each memory cell region MS in precharge circuit SA1 to precharge circuit SAn by MOS transistor NM1 and MOS transistor NM2 in the cross region CR (refer to FIG. 11). In a second embodiment, either an n-channel type MOS transistor setting the precharge signal PDL at H level or an n-channel type MOS transistor setting the precharge signal PDL at L level is formed in each cross region CR.

When made in this manner, because only one MOS transistor is formed in the cross region CR, there is no need for a separation region between the other MOS transistors, and compared with the first embodiment, an MOS transistor having a larger channel width can be formed. Thereby, in the semiconductor memory device according to the second embodiment, compared to the first embodiment, the rising time and falling time of the voltage level of the precharge signal PDL can be more rapid, and the access time can be accelerated.

Because the example of the operation of the semiconductor memory device according to the second embodiment is identical to that of the semiconductor memory device of the first embodiment, its explanation will be omitted. In the explanation of the operation, by substituting the MOS transistor NM1 by MOS transistor NMV or the MOS transistor NM2 by MOS transistor NMD, the explanation of the example of the operation of the first embodiment can be used as the explanation of the operation of the second embodiment.

As explained above, in the semiconductor memory device according to the second embodiment, the MOS transistor NMV and MOS transistor NMD are formed as an n-channel type. Thus, in the semiconductor memory device according to the second embodiment, as shown by the enlarged figure of the vicinity of the cross region CR in FIG. 5, an n-WELL region NW does not have to be formed in the cross region CR, and separation region SP for separating the n-WELL region NW and the p-WELL region is not necessary within the cross region CR, and MOS transistor NMV and MOS transistor NMD can each be formed having a large channel width in comparison with the conventional technology inside the cross region CR without increasing the chip size. The cross region CR and the sub-row decoder SWD become a p-WELL (or p-type substrate) that forms the n-channel type MOS transistor.

In addition, in the semiconductor memory device according to the second embodiment of the present invention, because the MOS transistor NMV that drives precharge circuit SW1 to precharge circuit SWn is not a p-channel type MOS transistor formed in an N-WELL, the mobility of the carrier is high compared to the p-channel type, and because precharge drive signal PDLD having a voltage higher than the value of "Vcc (the potential of the n-WELL forming sense amplifier SA1 to sense amplifier SAn)+Vt1" is input at the gate to drive the semiconductor memory device, the conductance of the ON state is improved, and the precharge signal PDL can be inverted from the L level to the H level. As a result, in the semiconductor memory device according to the second embodiment, the MOS transistor NM3 to MOS transistor NM5 that form the precharge circuit SW1 to precharge circuit SWn can be turned ON rapidly, and the time from the input of the control signal RASB to the beginning of the precharge is shorter than the conventional technology, and the access time can be accelerated.

Furthermore, in the semiconductor memory device according to the second embodiment, by making the channel width of the MOS transistor circuit NMD wider than the MOS transistor NMV of the precharge drive circuit, when the precharge operation of the bit line is stopped, the level of the precharge circuit can be rapidly inverted from H level to L level even in the state in which a continuous current is flowing between the MOS transistor NMV and the MOS transistor circuit NMD because the MOS transistor NMD causes sufficient current of the MOS transistor NMV to flow to the ground.

In addition, because the conductance of the ON state of the MOS transistor NM3, the MOS transistor NM4, and the MOS transistor NM5 that form each of the precharge circuits SW1 to precharge circuit SWn is improved, the voltage of the H level of the precharge circuit PDL can be made higher than the voltage Vcc used by the internal circuits.

At this time, a booster voltage Vc2 higher than the power source voltage Vcc (the potential of the n-WELL forming sense amplifier SA1 to sense amplifier SAn) can be connected to the drain of the MOS transistor NMV of precharge drive circuit. In addition, assuming that the threshold value voltage of MOS transistor NM3, MOS transistor NM4, and MOS transistor NM5 is "Vt2", the voltage of the precharge drive signal PDLD is preferably a voltage higher than "Vc2+Vt1+Vt2". Here, "Vt1" is the threshold value voltage of the MOS transistor NMV.

Therefore, a booster circuit (not illustrated) supplies a booster voltage VBOOT higher than "Vc2+Vt1+Vt2" to the voltage transformer circuit 3.

By the above implementation, the voltage Vc2 can be applied efficiently to the gates of the MOS transistor NM3, MOS transistor NM4, and MOS transistor NM5.

As a result, the conductance of the ON state of MOS transistor NM3, MOS transistor NM4, and MOS transistor NM5 that form precharge circuit SW1 to precharge circuit SWn can be improved, and the precharge time of each of the bit lines forming bit line pair BL1 to bit line pair BLn can be shortened. At this time, because the MOS transistor NMV is not a p-channel type MOS transistor, a voltage boosted higher than the power source voltage Vcc (the potential of the n-WELL forming sense amplifier SA1 to sense amplifier SAn) can be applied to the drain.

Figure 8:
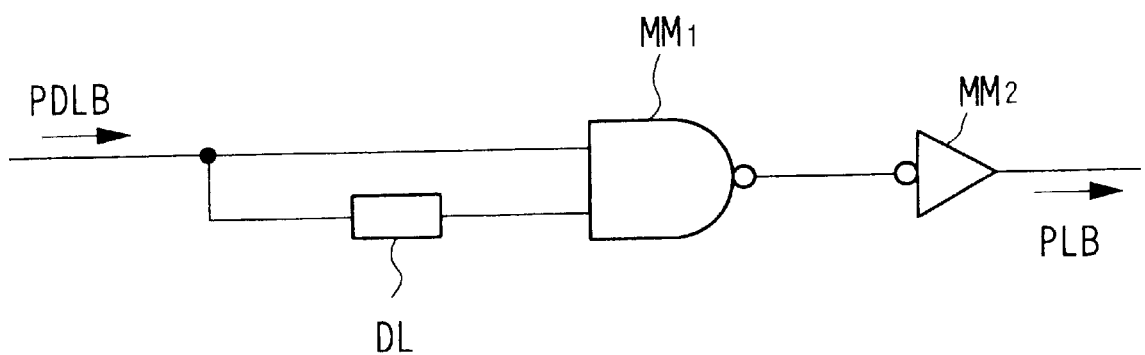
FIG. 8 is a block diagram showing the structure of a delay circuit used in the semiconductor memory device according to a third embodiment of the present invention.
Figure 9:
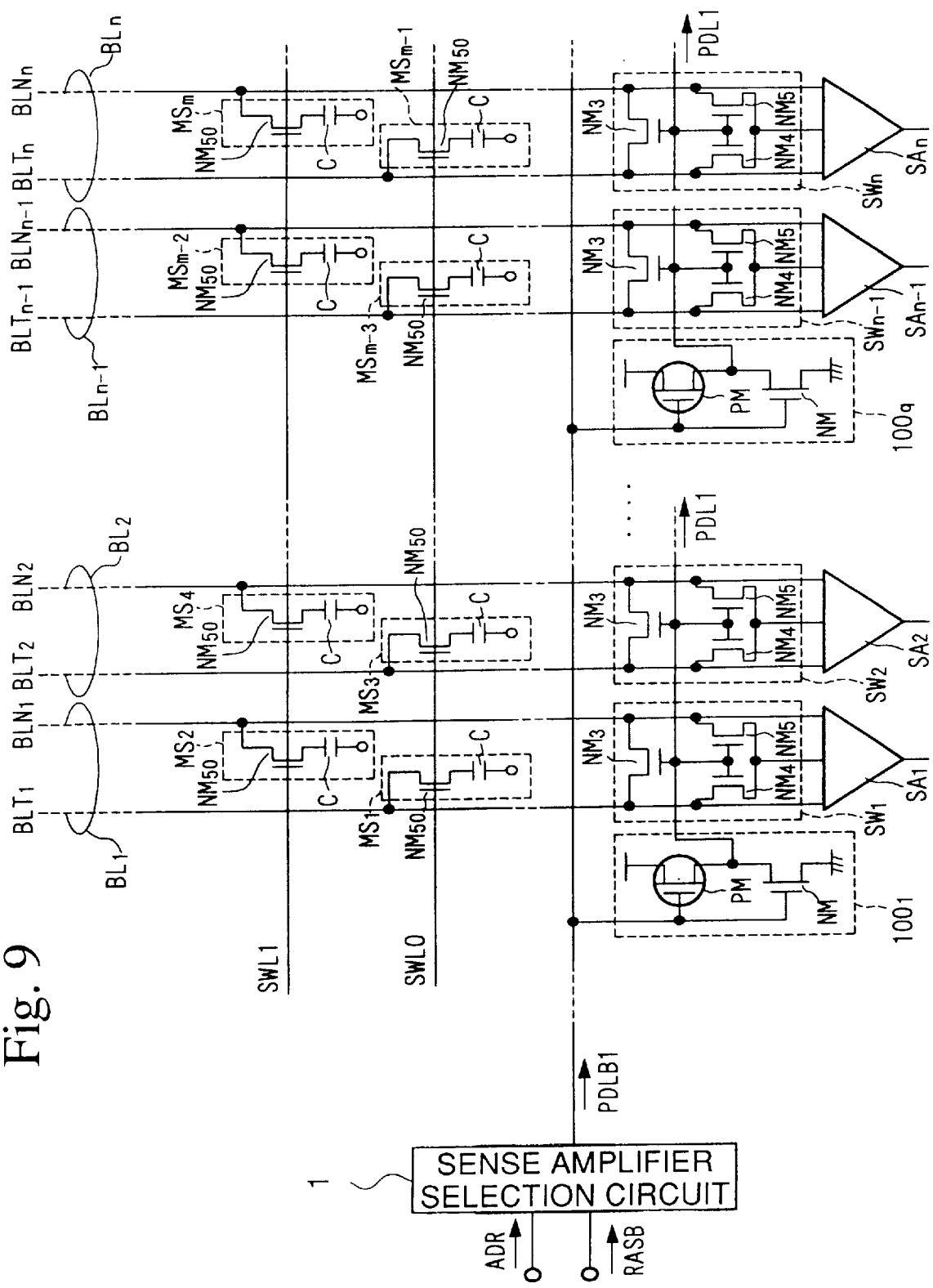
FIG. 9 is a block diagram showing the structure of a conventional example of a semiconductor memory device.
Figure 10:
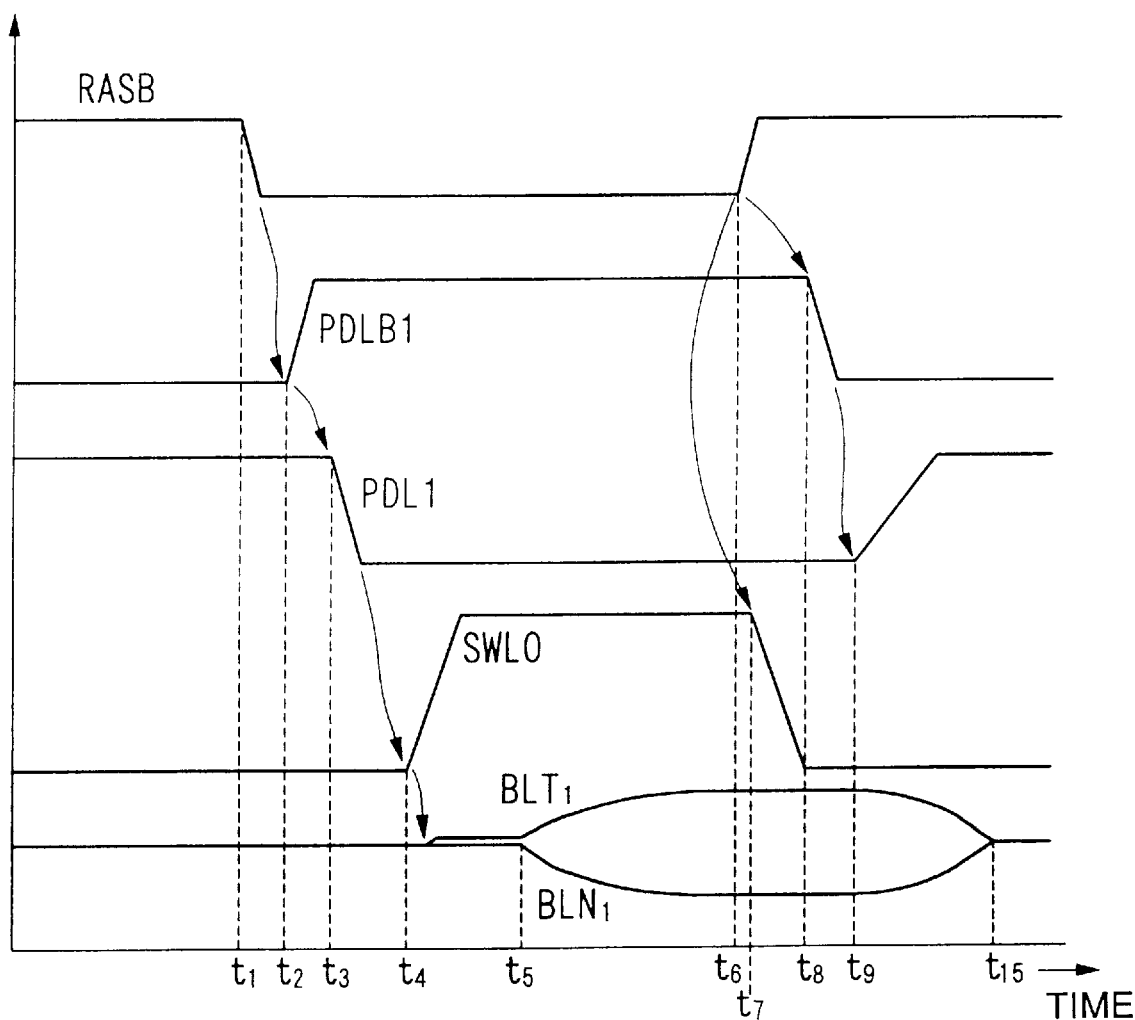
FIG. 10 is a timing chart showing an example of an operation of a conventional example of a semiconductor memory device.

Next, a third embodiment of the present invention will be explained referring to FIG. 8. FIG. 8 is a concept drawing showing the structure of a delay circuit that delays only the rise time. In the delay circuit in the first embodiment, after the precharge drive signal PDLD is inverted to L level and the MOS transistor NM1 is turned OFF, the precharge control signal PDLB is inverted to H level and the precharge signal PDL is inverted to L level. Thus, the delay circuit can be used to adjust the inversion time to H level of the precharge control signal PDLB. To implement this, in the block diagram in FIG. 1, this delay circuit is interposed between the output terminal of the sense amplifier selection circuit 1 and the gate of the MOS transistor NM2.

Similarly, in the second embodiment, after the precharge drive signal PDLD inverts to L level and the MOS transistor NMV is turned OFF, the precharge control signal PDLB is inverted to H level and the precharge signal PDL is inverted to L level. Thus, the delay circuit can be used to adjust the inversion time to H level of the precharge control signal PDLB. To implement this, in the block diagram in FIG. 7, this delay circuit is interposed between the output terminal of the sense amplifier selection circuit 1 and the gate of the MOS transistor NMD.

In FIG. 8, DL is a delay element comprising a resistor and a capacitor. In addition, the delay time of the delay element DL is set to the time from the precharge control signal PDLB being inverted to the MOS transistor NMV being turned OFF. MM1 is a NAND circuit, and outputs the logical sum of the input precharge control signal PDLB and the delayed signal of the precharge control signal PDLB. MM2 is an inverter, and inverts the output of the NAND circuit MM1, and outputs the result as a precharge stop signal PLB. Thereby, this delay circuit does not change the inversion time from H level to L level, and the inversion time from L level to H level can be delayed just by the delay time of the delay element DL.

Thereby, in the fist embodiment, the inversion time of the precharge control signal PDLB to the H level can be adjusted in coordination with the timing cycle in which the MOS transistor NM1 is turned OFF so that a continuous current does not flow between the MOS transistor NM1 and MOS transistor NM2. Similarly, in the second embodiment, the inversion time of the precharge control signal PDLB to the H level can be adjusted in coordination with the timing cycle in which the MOS transistor NMV is turned OFF so that continuous current does not flow between the MOS transistor NMV and MOS transistor NMD.

In the semiconductor memory device according to a first aspect of the present invention, a memory cell region formed from a plurality of memory cells, a plurality of word lines that select the memory cells, a word line drive circuit that, based on an externally supplied address signal, activates the word line connected to the memory designated by that address, a bit line that is connected to this memory cell and reads information stored in the memory cell selected by the activated word line as the voltage change from the specified precharge voltage, a sense amplifier that amplifies the potential difference between the bit line pairs, which are two adjacent bit lines combined together, and detects the data stored in this memory cell, a precharge circuit that precharges the potential of the two bit lines of this bit line pair connected to this sense amplifier before the word line selects the memory cell, and a precharge drive circuit that supplies a control signal of a specified H level voltage from a second n-channel type MOS transistor to a gate of an n-channel type first MOS transistor that forms this precharge circuit and supplies the precharge current to the bit line are provided, wherein the voltage of the ON signal turns ON the second MOS transistor and is input into the gate of this second MOS transistor is equal to or greater then the voltage value equal to the sum of the voltage of this control signal and the threshold value voltage of the second MOS transistor. Since the second MOS transistor forms an n-channel type MOS transistor, formation of an n-WELL region in the cross region CR becomes unnecessary, and a separation region SP for separating the n-WELL region NW from the p-WELL region in the cross region CR becomes unnecessary. Thereby a second MOS transistor having a large channel width in comparison the conventional technology can be formed in the cross region CR without increasing the chip size of the semiconductor memory device, and because the second MOS transistor is not a p-channel type MOS transistor formed in an n-WELL, the gate of the second MOS transistor that supplies the H level signal to the first MOS transistor gate can be driven by a voltage that is higher than the value of the "power source voltage Vcc (the potential of the n-WELL)+the threshold value voltage of the second MOS transistor." Thus, the conductance of the ON state of the second MOS transistor can be improved, the first MOS transistor can be turned ON rapidly, the precharge of the bit lines can begin rapidly, and thereby the access time can be accelerated.

In a second aspect of the semiconductor memory device according to the first aspect of the present invention, a voltage transformer circuit that outputs from the internal logic circuit an H level voltage of the charge signal that turns ON the second MOS transistor is provided, and this output voltage, serving as this ON signal, is equal to or greater than the voltage value that equals the sum of the voltage of the control signal and the threshold value voltage of this second MOS transistor. Thus, when the second MOS transistor is ON, the voltage of the control signal is output, the conductance of the ON state of the second MOS transistor can be made efficient, the first MOS transistor can be turned ON rapidly, the precharge of the bit line can be started rapidly, and thereby access time can be accelerated.

In a third aspect of the semiconductor memory device according to the first and second aspect of the present invention, the voltage of the control signal is set to a higher value that the power source voltage that is used by the internal logic circuit. Thus, the conductance of the ON state of the first MOS transistor can be improved, the precharge tie of the bit lines can be shortened, and thereby the access time can be accelerated.

In a fourth aspect of the semiconductor memory device according to any of the first through third aspects of the present invention, before a timing cycle in which the precharge circuit carries out the precharge for the bit line pairs, the voltage transformation circuit supplies the voltage-transformed voltage to the drive circuit. Thus, when the control signal commanding the precharge is input, the first MOS transistor can be rapidly turned ON and the precharge of the bit lines can be started rapidly since a voltage higher than the voltage value of the voltage of the control signal added to the threshold value voltage of the second MOS transistor can be supplied to the gate of the second transistor, and thereby the access time can be accelerated.

In a fifth aspect of the semiconductor memory device according to any of the first through fourth aspects of the present invention, an n-channel type third MOS transistor is provided in which a source is grounded, a drain is connected to the gate of the first MOS transistor, and the precharge stop signal having a logic reverse that of the charge signal from the prior stage of the voltage transformation circuit is input into a gate. Thus, the precharge of the bit lines can be rapidly stopped and the amplification processing in the sense amplifier can be started, and thereby the access time can be accelerated.

In a sixth aspect of the semiconductor memory device according to any of the first through fifth aspects of the present invention, this precharge drive circuit is formed by the second MOS transistor and the third MOS transistor. Thus, the first MOS transistor can be rapidly turned ON, the precharge of the bit lines can be rapidly started, the precharge of the bit lines can be rapidly stopped, and the amplification processing of the sense amplifiers can be started, and thereby the access time can be accelerated.

In a seventh aspect of the semiconductor memory device according to any of the first through sixth aspects of the present invention, at the part where the sense amplifier and the word line drive circuit intersect, there is a cross region wherein said sense amplifier, said word line drive circuit, or said memory cell are not formed, and the second MOS transistor and the third MOS transistor are formed in this cross region. Thus, the second MOS transistor and the third MOS transistor are n-channel type MOS transistors having a mobility higher than the p-channel type, making an n-WELL in the cross region is unnecessary, and the channel width of second MOS transistor and the third MOS transistor can be increased by the portion of the area in which formation of a separation region between the n-WELL and the p-WELL need not be formed, the precharge of the bit lines can be rapidly started, the precharge of the bit lines can be rapidly stopped, the amplification processing of the sense amplifier can be started, and thereby the access time can be accelerated.

In a eighth aspect of the semiconductor memory device according to any of the first through seventh aspects of the present invention, at the part where the sense amplifier and the word line drive circuit intersect, there is a cross region wherein said sense amplifier, said word line drive circuit, or said memory cell are not formed, and the second MOS transistor is formed in one cross region, and the third MOS transistor is formed in the other cross area. Thus, because only one MOS transistor is formed in each cross region, a separation region between the other MOS transistors is unnecessary, a wider MOS transistor can be formed in comparison to the case in which two MOS transistors are formed in the cross region, the precharge of the bit lines can be started rapidly, the precharge of the bit lines can be stopped rapidly, the amplification processing of the sense amplifier can be started, and thereby the access time can be accelerated.

In a ninth aspect of the semiconductor memory device according to any of the first through eighth aspects of the present invention, a delay circuit is provided between the gate of the third MOS transistor and the stage before the voltage transformation circuit, wherein the propagation to the gate of the third MOS transistor of the precharge stop signal is delayed by a specified interval, that interval being only the time of the rise of the precharge stop signal. Thus, the third MOS transistor can be turned ON in coordination with the timing cycle in which the second transistor is turned OFF so that a continuous current does not flow between the second MOS transistor and the third MOS transistor, and the inversion time to H level of the precharge signal input into the gate of the third MOS transistor can be adjusted, and thereby low energy consumption is possible.

In a tenth aspect of the semiconductor memory device according to any of the first through ninth aspects of the present invention, the channel width of the third MOS transistor is formed so as to be larger than the second channel width. Thus, when the precharge operation of the bit lines is stopped, even if a continuous current flows in the second MOS transistor and the third MOS transistor, since the third MOS transistor causes the current of the second MOS transistor to flow sufficiently to the ground point, inverting the level of the precharge signal from H level to L level can be carried out rapidly, and thereby the access time can be accelerated.

What is claimed is:

1. A semiconductor memory device comprising:
   a memory cell region formed by a plurality of memory cells;
   a plurality of word lines that select said memory cells;
   a word line drive circuit that, based on an externally supplied address signal, activates said word lines connected to the memory designated by that address;
   a bit line that is connected to a memory cell and reads information stored in said memory cell selected by the activated word line as a voltage change from a specified precharge voltage;
   a sense amplifier that amplifies the potential difference between bit line pairs, which are two adjacent bit lines combined together, and detects the data stored in said memory cell;
   a precharge circuit that precharges the potential of said two bit lines of said bit line pair connected to said sense amplifier before said word line selects said memory cell; and
   a precharge drive circuit that supplies a control signal of a specified H level voltage from a second n-channel type MOS transistor to a gate of an n-channel type first MOS transistor that forms said precharge circuit and supplies the precharge current to said bit line,
   wherein a voltage of an ON signal turns ON said second MOS transistor and is input into the gate of this second MOS transistor is equal to or greater than the voltage value equal to the sum of the voltage of said control signal and the threshold value voltage of the second MOS transistor.

2. A semiconductor memory device according to the claim 1, wherein a voltage transformer circuit that outputs from the internal logic circuit an H level voltage of the charge signal that turns ON the second MOS transistor is provided, and this output voltage, serving as this ON signal, is equal to or greater than the voltage value that equals the sum of the voltage of said control signal and the threshold value voltage of said second MOS transistor.

3. A semiconductor memory device according to claim 1, wherein the voltage of said control signal is set to a higher value than the power source voltage that is used by the internal logic circuit.

4. A semiconductor memory device according to claim 1, wherein, before a timing cycle in which the precharge circuit carries out the precharge for said bit line pairs, said voltage transformation circuit supplies the voltage-transformed voltage to said precharge drive circuit.

5. A semiconductor memory device according to claim 1, wherein an n-channel type third MOS transistor is provided in which a source is grounded, a drain is connected to the gate of said first MOS transistor, and the precharge stop signal having a logic reverse that of the charge signal from the prior stage of said voltage transformation circuit is input into a gate.

6. A semiconductor memory device according to 5, wherein said precharge drive circuit is formed by said second MOS transistor and said third MOS transistor.

7. A semiconductor memory device according to claim 5, wherein, at the part where said sense amplifier and said word line drive circuit intersect, there is a cross region wherein said sense amplifier, said word line drive circuit, or said memory cell are not formed, and said second MOS transistor and said third MOS transistor are formed in this cross region.

8. A semiconductor memory device according to claim 5, wherein, at the part where said sense amplifier and said word line drive circuit intersect, there is a cross region wherein said sense amplifier, said word line drive circuit, or said memory cell are not formed, and said second MOS transistor is formed in one cross region, and said third MOS transistor is formed in the other cross area.

9. A semiconductor memory device according to claim 5, wherein a delay circuit is provided between the gate of the third MOS transistor and the stage before said voltage transformation circuit, and wherein the propagation to the gate of said third MOS transistor of the precharge stop signal is delayed by a specified interval, that interval being only the time of the rise of said precharge stop signal.

10. A semiconductor memory device according to claim 5, wherein the channel width of said third MOS transistor is formed so as to be larger than said second channel width.

* * * * *